United States Patent
Lee et al.

(10) Patent No.: US 7,719,068 B2
(45) Date of Patent: May 18, 2010

(54) MULTI-BIT ELECTRO-MECHANICAL MEMORY DEVICE AND METHOD OF MANUFACTURING THE SAME

(75) Inventors: Sung-Young Lee, Yongin-si (KR); Dong-Won Kim, Seongnam-si (KR); Min-Sang Kim, Seoul (KR); Eun-Jung Yun, Seoul (KR); Dong-Gun Park, Seongnam-si (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 12/002,668

(22) Filed: Dec. 18, 2007

(65) Prior Publication Data

US 2008/0144364 A1 Jun. 19, 2008

(30) Foreign Application Priority Data

Dec. 19, 2006 (KR) .................. 10-2006-0129884

(51) Int. Cl.
*G11C 11/50* (2006.01)
(52) U.S. Cl. .................... 257/415; 438/52; 365/164
(58) Field of Classification Search ............ 257/415, 257/E32.001; 438/52; 365/164
See application file for complete search history.

(56) References Cited

U.S. PATENT DOCUMENTS

| | | | |
|---|---|---|---|
| 4,979,149 A | 12/1990 | Popovic et al. | |
| 6,054,745 A | 4/2000 | Nakos et al. | |
| 6,473,361 B1 | 10/2002 | Chen et al. | |
| 6,509,605 B1 | 1/2003 | Smith | |
| 6,611,033 B2 | 8/2003 | Hsu et al. | |
| 6,640,432 B1 | 11/2003 | Mathieu et al. | |
| 6,990,009 B2 * | 1/2006 | Bertin et al. ............... 365/151 |
| 7,056,758 B2 | 6/2006 | Segal et al. | |
| 7,071,023 B2 | 7/2006 | Bertin et al. | |
| 2006/0038643 A1 | 2/2006 | Xu et al. | |
| 2006/0051920 A1 | 3/2006 | Yamaguchi et al. | |
| 2006/0091440 A1 | 5/2006 | Park et al. | |
| 2006/0138604 A1 | 6/2006 | Kirby et al. | |
| 2007/0086237 A1 * | 4/2007 | Tiwari et al. ............... 365/174 |
| 2008/0137404 A1 * | 6/2008 | Park .......................... 365/164 |
| 2009/0129139 A1 * | 5/2009 | Kam et al. ................. 365/129 |

FOREIGN PATENT DOCUMENTS

WO WO 2007/130919 * 11/2007

* cited by examiner

*Primary Examiner*—Bradley K Smith
*Assistant Examiner*—Jami M Valentine
(74) *Attorney, Agent, or Firm*—Mills & Onello, LLP

(57) ABSTRACT

There are provided a multi-bit electro-mechanical memory device capable of enhancing or maximizing a degree of integration of the memory device and a method of manufacturing the multi-bit electro-mechanical memory device which includes a substrate, a bit line on the substrate, and extending in a first direction; a word line on the bit line, insulated from the bit line, and extending in a second direction transverse to the first direction, and a cantilever electrode including a shape memory alloy. The cantilever electrode has a first portion electrically connected to the bit line and a second portion extending in the first direction, and spaced apart from the word line by an air gap, wherein the cantilever electrode, in a first state, is in electrical contact with the word line, and, in a second state, is spaced apart from the word line.

13 Claims, 15 Drawing Sheets

I I'

MULTI-BIT ELECTRO-MECHANICAL MEMORY DEVICE AND METHOD OF MANUFACTURING THE SAME

CROSS-REFERENCE TO RELATED APPLICATION

This application claims the benefit of Korean Patent Application No. 10-2006-0129884, filed Dec. 19, 2006, the contents of which are hereby incorporated herein by reference in their entirety.

BACKGROUND OF THE INVENTION

1. Field of the Invention

The present invention relates to a memory device and a method of manufacturing the same, and more particularly, to a multi-bit electro-mechanical memory device and a method of manufacturing the multi-bit electro-mechanical memory device, in which predetermined data is programmed and read through switching operations of a plurality of cantilever electrodes that are symmetrically formed about a trench.

2. Description of Related Art

In general, memory devices that store information may be classified into volatile memory devices and non-volatile memory devices. Volatile memory devices, which can include dynamic random access memories (DRAMs), static random access memories (SRAMs) or the like, have a characteristic in that a data input/output operation is fast, but stored data is erased when power supplied to the volatile memory device is stopped. On the other hand, non-volatile memory devices, which can include erasable programmed read only memories (EPROM), electrically erasable programmed read only memories (EEPROM) or the like, have a characteristic in that a data input/output operation is slow, but stored data is maintained in the memory even though power supplied to the memory is stopped.

Such conventional memory devices are developed by employing metal oxide semiconductor field effect transistors (MOSFETs) based on metal oxide semiconductor (MOS) technologies. For example, a stack gate type transistor memory device has been developed having a structure stacked on a silicon semiconductor substrate, and a trench gate type transistor memory device has been developed having a structure in the semiconductor substrate. However, in conventional MOSFETs, a width and length of a channel should be longer than a predetermined length in order to prevent a short channel effect, and a thickness of a gate insulating layer formed between a gate electrode above the channel and the semiconductor substrate should be extremely thin. For this reason, it is difficult to implement a memory device having a nano-graded ultrafine structure.

Therefore, studies on memory devices having a structure capable of substituting for MOSFETs have been actively conducted. Recently, a micro electro-mechanical system (MEMS) technology and a nano electro-mechanical system (NEMS) technology, which are applied and developed from semiconductor technologies, have received attention. A non-volatile memory device using the MEMS technology has been disclosed in U.S. Pat. No. 6,054,745, incorporated herein by reference in its entirety.

Hereinafter, a conventional memory device will be described with reference to the accompanying drawings.

FIG. 1 is a cross-sectional view schematically illustrating a conventional memory device;

In the conventional memory device shown in FIG. 1, a field effect transistor (FET) sensing portion 221, a drawing electrode portion 223 and a cantilever electrode support portion 225 are formed on a shallow trench isolation (STI) 224 of a substrate 222 to be individually divided. A cantilever electrode 240 has a side 238 that is supported by the cantilever electrode support portion 225 while being electrically connected thereto, and the cantilever electrode 240 is formed to be spaced apart from the drawing electrode portion 223 and the FET sensing portion 221 at a predetermined height. Here, the cantilever electrode 240 can be bent in a direction of a drawing electrode 232 by an electric field induced in the drawing electrode portion 223. Thereafter, although the electric field induced in the drawing electrode portion 223 is eliminated, the cantilever electrode 240 can maintain its bent state due to an electric field induced from electrons captured in a poly-silicon gate electrode 230 of the FET sensing portion 221. For example, the poly-silicon gate electrode 230 corresponds to a floating electrode of a flash memory device, which captures electrons tunneled through a tunnel oxide layer made of a dielectric substance formed on a top surface of a source-drain region 227 of the FET sensing portion 221. The drawing electrode portion 223 and the cantilever electrode support portion 225 are made of a poly-silicon material, that is the same as a metal of the poly-silicon gate electrode 230. Similarly, the cantilever electrode 240 is made of a poly-silicon material from the cantilever electrode support portion 225.

Accordingly, the conventional memory device comprising the drawing electrode 232 allows the cantilever electrode 240 to be bent by an electrostatic force below the cantilever electrode 240 floated at a predetermined height. Further, the FET sensing portion 221 allows the cantilever electrode 240 to maintain its bent state, thereby implementing a non-volatile memory device.

However, the conventional memory device has several disadvantages. First, in the conventional memory device, the drawing electrode portion 223 allowing the cantilever electrode 240 having a horizontal state to be bent and the FET sensing portion 221 allowing the cantilever electrode 240 to maintain its bent state are separately formed on the same plane. In addition, the cantilever electrode 240 must be sufficiently long to be positioned over top portions of the drawing electrode portion 223 and the FET sensing portion 221. Thus, there is a disadvantage in that a degree of integration of the memory device is lowered.

Second, the conventional memory device allows only 1 bit of data per unit cell, the unit cell including the cantilever electrode 240, the drawing electrode 232 and the FET sensing portion 221, to be programmed or read in the conventional memory. Thus, it is difficult for multi-bit data to be stored in the conventional memory device.

Third, in the conventional memory device, each of the cantilever electrode 240 and the drawing electrode portion 223, which allows the cantilever electrode 240 to be bent down, is composed of a poly-silicon material having a resistance relatively higher than metal. Thus, power consumption can be undesirably increased.

SUMMARY OF THE INVENTION

Embodiments of the present invention are directed to multiple-bit electromechanical memory devices and methods of manufacturing thereof that address and alleviate the above-identified limitations of conventional devices.

Embodiments of the present invention provide a multi-bit electro-mechanical memory device, wherein the length of a cantilever electrode is reduced, and a drawing electrode with which the cantilever electrode comes into contact and an FET sensing portion are unified, so that a degree of integration of the device can be enhanced and maximized, and a method of manufacturing the multi-bit electro-mechanical memory device.

Embodiments of the present invention further provide a multi-bit electro-mechanical memory device capable of allowing data with 2 bits or more per unit cell to be input/output, and a method of manufacturing the multi-bit electro-mechanical memory device.

Embodiments of the present invention further provide a multi-bit electro-mechanical memory device, wherein a switching electrode such as a cantilever electrode and a drawing electrode allowing the cantilever electrode to be bent are made of a conductive metallic material with a resistance lower than a poly-silicon material, so that power consumption can be reduced, and a method of manufacturing the multi-bit electro-mechanical memory device.

In one aspect, a multi-bit electro-mechanical memory device, comprises: a substrate; a bit line on the substrate, the bit line extending in a first direction; a word line on the bit line, insulated from the bit line, and extending in a second direction transverse to the first direction; and a cantilever electrode including a shape memory alloy. The cantilever electrode has a first portion electrically connected to the bit line and a second portion extending in the first direction parallel with the bit line, and spaced apart from the word line by an air gap between a surface of the word line and the cantilever electrode, wherein the cantilever electrode, in a first state, is in electrical contact with the word line, and, in a second state, is spaced apart from the word line.

In an embodiment, the cantilever electrode includes the shape memory alloy, when in the first state, is deformed in a direction of the word line to electrically contact the word line when a first voltage is applied between the bit line and word line, and, when in the second state, is spaced apart from the word line when a second voltage lower than the first voltage and a current with a predetermined intensity are applied between the bit line and word line. In another embodiment, the shape memory alloy includes at least one of a TiNi alloy, a Ni—Co—Al alloy, a Ni—Mn—Ga alloy and a Cu—Zn—Al alloy.

In an embodiment, multi-bit electro-mechanical memory device further comprises a spacer at a sidewall of the word line, wherein the first portion of the cantilever electrode is electrically insulated from the word line by the spacer.

In an embodiment, a first interlayer dielectric layer is between the bit line and the word line, and a second interlayer dielectric layer is adjacent to the cantilever electrode, and on a surface of the bit line.

In another aspect, a multi-bit electro-mechanical memory device comprises: a substrate; a bit line on the substrate, the bit line extending in a first direction; first and second lower word lines, insulated from the bit line, and extending in a second direction transverse to the first direction, the first and second lower word lines separated by a trench; first and second cantilever electrodes each including a shape memory alloy; and first and second upper word lines. The first and second cantilever electrodes each have a first portion electrically connected to the bit line, the first cantilever electrode has a second portion extending over the first lower word line and the second cantilever electrode has a second portion extending over the second lower word line. The first and second cantilever electrodes are spaced apart from the first and second lower word lines, respectively, by air gaps between top surfaces of the first and second lower word lines and the first and second cantilever electrodes, wherein the first and second cantilever electrodes, in a first state, are in electrical contact with the first and second lower word lines, and, in a second state, are spaced apart from the first and second lower word lines. The first and second upper word lines are positioned at a predetermined height above the first and second cantilever electrodes, the first and second upper word lines in the second direction parallel with the first and second lower word lines.

In an embodiment, each of the first and second cantilever electrodes includes the shape memory alloy, when in the first state, is deformed in a direction of one of the first and second upper word lines and the first and second lower word lines to electrically come into contact with the one of the first and second upper word lines and the first and second lower word lines when a first voltage is applied between the bit line and the one of the first and second upper word lines and the first and second lower word lines, and, when in the second state, is spaced apart from, and electrically isolated from, the first and second upper word lines and the first and second lower word lines by a second voltage lower than the first voltage and a current with a predetermined intensity that are applied between the bit line and each of the first and second lower word lines or each of the first and second upper word lines. In another embodiment, the shape memory alloy includes at least one of a TiNi alloy, a Ni—Co—Al alloy, a Ni—Mn—Ga alloy and a Cu—Zn—Al alloy.

In an embodiment, the multi-bit electro-mechanical memory device further comprises first and second spacers at sidewalls of the first and second lower word lines, wherein the first portions of the first and second cantilever electrodes are electrically insulated from the first and second lower word lines by the first and second spacers.

In an embodiment, the first and second spacers include an air gap region between the first portion of the first and second cantilever electrodes and the first and second lower word lines, allowing at least one of the first and second cantilever electrodes to be spaced apart from the first and second lower word lines.

In an embodiment, a first interlayer dielectric layer is between the bit line and the first and second lower word lines, a second interlayer dielectric layer is adjacent to the first and second cantilever electrodes and on a surface of the bit line, and a third interlayer dielectric layer is formed on the second interlayer dielectric layer.

In an embodiment, the trench exposes a top surface of the first interlayer dielectric layer in the second direction.

In an embodiment, a fourth interlayer dielectric layer seals an interior of the trench at a top of the trench.

In another aspect, a method of manufacturing a multi-bit electro-mechanical memory device comprises: forming a bit line on a substrate extending in a first direction; forming a stack including a first interlayer dielectric layer, a lower word line and a first sacrificial layer on the bit line, the stack extending in a second direction transverse to the bit line in the first direction, forming spacers on sidewalls of the stack; forming a cantilever electrode including a shape memory alloy in the first direction parallel to the bit line above the first sacrificial layer, so as to be electrically connected to the bit line on a top surface thereof at both sides of the stack, the cantilever electrode being isolated from the lower word line; forming a second interlayer dielectric layer on the top surface of the bit line and a sidewall of the cantilever electrode; forming a trench to expose the first interlayer dielectric layer by removing a portion of the cantilever electrode, the first sacrificial layer and the lower word line in the second direction; and removing the first sacrificial layer exposed by the trench.

In an embodiment, the cantilever electrode is formed by depositing a shape memory alloy, comprising at least one of a TiNi alloy, a Ni—Co—Al alloy, a Ni—Mn—Ga alloy or a Cu—Zn—Al alloy, on the substrate through a physical or chemical vapor deposition method. In another embodiment, the first sacrificial layer is made of a poly-silicon material, and the first sacrificial layer is removed by isotropically etching the poly-silicon material by a wet or dry etching process.

In an embodiment, an isotropic etchant is used in the wet etching method includes a mixed solution in which deionized water is mixed at a predetermined density with a strong acid such as nitric acid, hydrofluoric acid or acetic acid, and an isotropic reactive gas used in the dry etching method includes fluorocarbon-based gas such as $CF_4$ or $CHF_3$.

In an embodiment, a second sacrificial layer and an upper word line are formed in the second direction above the cantilever electrode, a third interlayer dielectric layer is formed on the second interlayer dielectric layer and on the upper word line, a central top portion of the upper word line is exposed, the first interlayer dielectric layer is exposed by sequentially removing the upper word line, the second sacrificial layer, the cantilever electrode, the first sacrificial layer and the lower word line, and the first and second sacrificial layers exposed by the trench are removed.

In an embodiment, a line width of a hard mask layer formed on the top surface of the upper word line to be patterned is reduced when forming the upper word line, the third interlayer dielectric layer is formed on the second interlayer dielectric layer and on the upper word line and on the hard mask layer, the third interlayer dielectric layer is planarized to expose the hard mask layer, and the upper word line is exposed by removing the hard mask layer.

In an embodiment, a fourth interlayer dielectric layer screens a top of the trench to seal an interior of the trench.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete.

BRIEF DESCRIPTION OF THE DRAWINGS

The above and other features and advantages of the present invention will become more apparent to those of ordinary skill in the art by describing in detail preferred embodiments thereof with reference to the attached drawings. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DETAILED DESCRIPTION OF THE INVENTION

Hereinafter, aspects of the present invention will be described by explaining illustrative embodiments in accordance therewith, with reference to the attached drawings. While describing these embodiments, detailed descriptions of well-known items, functions, or configurations are typically omitted for conciseness.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

Figure 1:
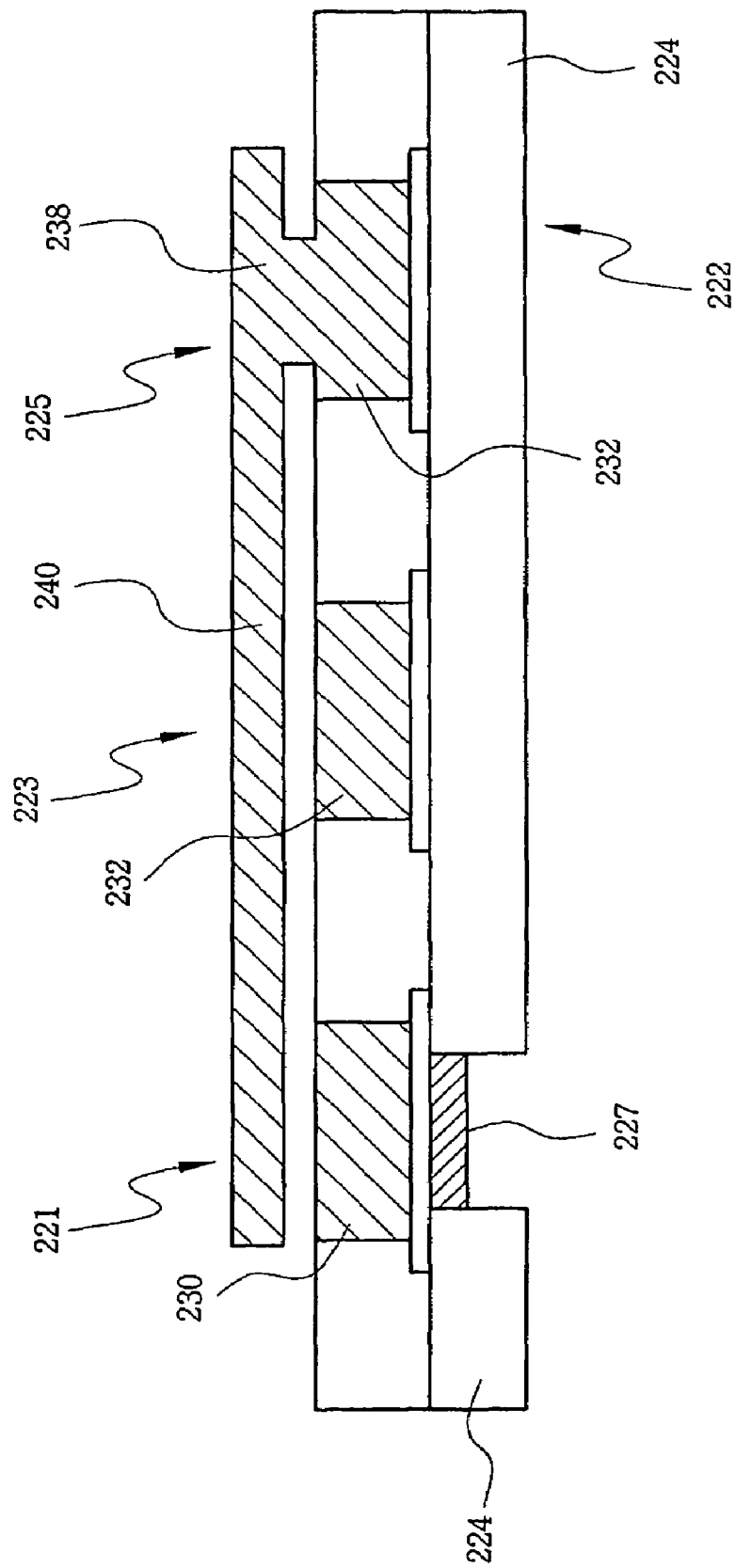
FIG. 1 is a cross-sectional view schematically illustrating a conventional memory device.
Figure 2:
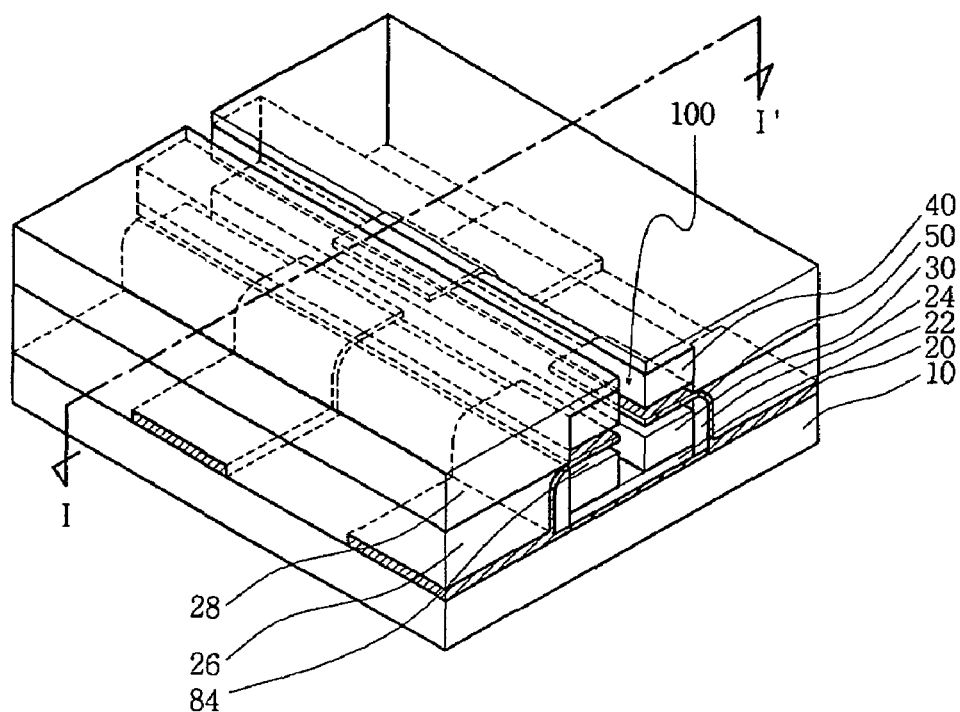
FIG. 2 is a perspective view of a multi-bit electro-mechanical memory device according to an embodiment of the present invention.
Figure 3:
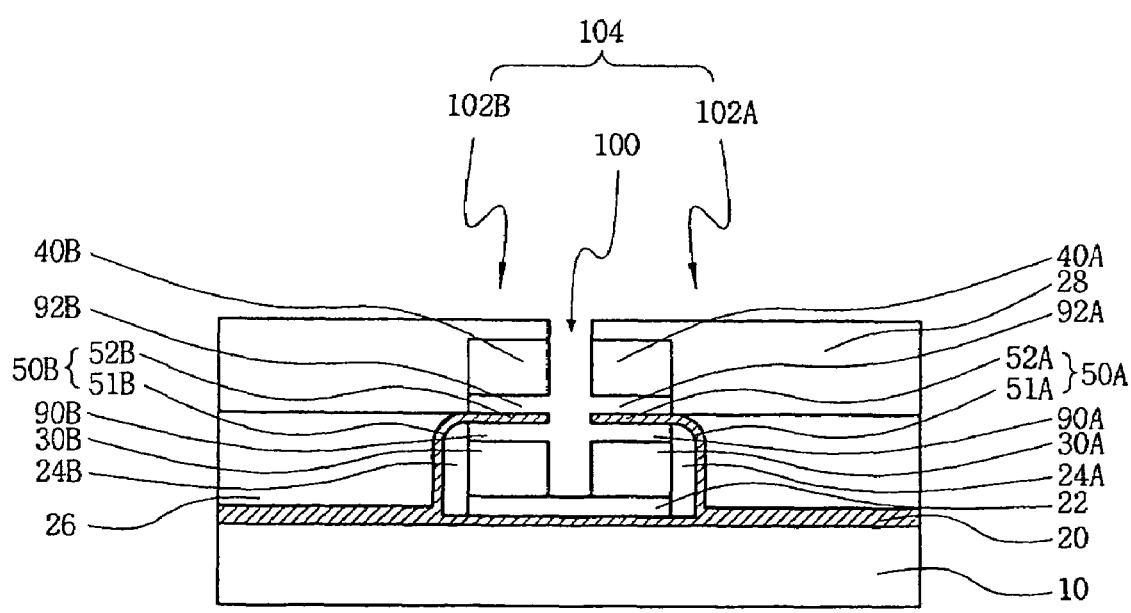
FIG. 3 is a cross-sectional view taken along line I-I' in FIG. 2.

FIG. 2 is a perspective view of a multi-bit electro-mechanical memory device according to an embodiment of the present invention, and FIG. 3 is a cross-sectional view taken along line I-I' in FIG. 2.

As shown in FIGS. 2 and 3, a plurality of bit lines 20 are formed in a first direction on a substrate 10 having a predetermined flat surface. For example, the substrate 10 includes an insulative or semiconductor substrate with superior flexibility. Further, each of the plurality of bit lines 20 includes at least one or more of a crystal-silicon or poly-silicon material doped with conductive impurities, and a conductive metallic material with superior conductivity, such as gold, silver, copper, aluminum, tungsten, tungsten silicide, titanium, nitride titanium, tantalum or tantalum silicide. A first interlayer dielectric layer 22 is formed in a second direction transverse to the first direction of the bit lines 20 and is formed on the bit lines 20. The first interlayer dielectric layer 22 comprises a dielectric substance allowing the bit lines to be selectively insulated. The first interlayer dielectric layer 22 includes any one or more of a silicon oxide layer, a silicon nitride layer and a silicon oxide/nitride layer.

First and second lower word lines 30A and 30B can be isolated from each other by a trench 100, and are parallel with each other in the second direction on the first interlayer dielectric layer 22. Here, since the first and second lower word lines 30A and 30B are isolated from the substrate 10 and the plurality of bit lines 20 by the first interlayer dielectric layer 22, electrical signals can be freely applied through the bit lines 20. In an embodiment, the first and second lower word lines 30A and 30B comprise a conductive metallic material with superior conductivity, such as gold, silver, copper, aluminum, tungsten, tungsten silicide, titanium, nitride titanium, tantalum or tantalum silicide, or other materials that are similar to the materials used to form the bit lines 20. First and second spacers 24A and 24B allow the first and second lower word lines 30A and 30B to be electrically insulated from the outside, and are formed on outer walls of the word lines 30A and 30B, respectively, that are opposite the inner walls of the first and second lower word lines 30A and 30B exposed by the trench 100. For example, each of the first and second spacers 24A and 24B includes a silicon nitride layer or silicon oxide/nitride layer. Each of the first and second spacers 24A and 24B is shaped to have a height that is higher than a height of the first and second lower word lines 30A and 30B.

First and second cantilever electrodes 50A and 50B are floated or positioned at a predetermined height above the first and second lower word lines 30A and 30B, respectively, by first and second lower air gaps 90A and 90B, while being supported by the first and second spacers 24A and 24B that extend from regions adjacent to the outer walls of the first and second lower word lines 30A and 30B. The first and second cantilever electrodes 50A and 50B may become deformed from its original configuration, which, is shown in FIGS. 2-3, in a direction toward the first and second lower word lines 30A and 30B, for example, in the deformed position shown in FIG. 5B, due to an electrostatic force caused by an electric field that is induced in the first and second lower air gaps 90A and 90B. Specifically, the electrostatic force, when applied, can cause the first and second cantilever electrodes 50A and 50B to change shape, and become sufficiently deformed to contact the first and second lower word lines 30A and 30B, respectively. In an embodiment, each of the first and second cantilever electrodes 50A and 50B can be formed of a shape memory alloy (SMA), also referred to as a smart alloy or memory alloy. Therefore, the first and second cantilever electrodes 50A and 50B are respectively isolated from the first and second word lines 30A and 30B due to self-heating that occurs when a current is applied through the first and second cantilever electrodes 50A and 50B and the first and lower word lines 30A and 30B, which are electrically connected to each other, so that the cantilever electrodes 50A and 50B can be restored to their original states, i.e., positioned at a uniform height above the first and second lower word lines 30A and 30B. In an embodiment, the shape memory alloy includes a TiNi alloy, a Ni—Co—Al alloy, a Ni—Mn—Ga alloy, a Cu—Zn—Al alloy or the like. Accordingly, in the multi-bit electro-mechanical memory device according to this embodiment, each of the first and second cantilever electrodes 50A and 50B are made of a shape memory alloy such that the first and second cantilever electrodes 50A and 50B are respectively deformed, i.e., change shape, to contact the first and second lower word lines 30A and 30B due to an electrostatic force; and can be restored to their original shapes, respectively, and, therefore be isolated from the first and second lower word lines 30A and 30B, as a result of a change in temperature that occurs while being self-heated by a current with a predetermined intensity. For this reason, a non-volatile memory device can be implemented.

The first and second cantilever electrodes 50A and 50B comprise first and second deformation portions 52A and 52B, respectively, that extend in a substantially horizontal direction parallel with a surface of the substrate 10. Further, the first and second cantilever electrodes 50A and 50B comprise first and second fixing portions 51A and 51B that extend in a substantially vertical direction relative to a horizontal direction of the bit lines 20, and the first and second cantilever electrodes 50A and 50B are electrically connected to the bit lines 20 via the first and second fixing portions 51A and 51B. The ends of the first and second cantilever electrodes 50A and 50B are isolated from each other by the trench 100. Further, the first and second fixing portions 51A and 51B are isolated from the outer walls of the first and second lower word lines 30A and 30B, respectively, by the first and second spacers 24A and 24B, each of the spacers 24A and 24B being made of an insulative material. Further, a second interlayer dielectric layer 26 having a height identical or similar to heights of the first and second cantilever electrodes 50A and 50B is formed on top surfaces of the bit lines 20. The second interlayer dielectric layer 26 surrounds the outer walls of the first and second cantilever electrodes 50A and 50B, whereby the multi-bit electro-mechanical memory device is insulated from a neighboring memory device that may be formed close thereto.

In an embodiment, first and second upper word lines 40A and 40B are floated or positioned on an opposite side of the first and second cantilever electrodes 50A and 50B as the first and second lower word lines 30A and 30B, and are floated or positioned at a predetermined height above the first and second cantilever electrodes 50A and 50B by first and second upper air gaps 92A and 92B that are formed between the first and second cantilever electrodes 50A and 50B and the first and second upper word lines 40A and 40B, respectively. Theu first and second upper word lines 40A and 40B are isolated from each other by the trench 100. The first and second upper word lines 40A and 40B are formed in the second direction above the first and second lower word lines 30A and 30B, respectively. A third interlayer dielectric layer 28 is formed on a top surface of the second interlayer dielectric layer 26, and at outer walls of the first and second upper word lines 40A and 40B to insulate the first and second upper word lines 40A and 40B while providing structural support for the first and second upper word lines 40A and 40B. In an embodiment, each of the second and third interlayer dielectric layers 26 and 28 includes a silicon oxide layer, silicon nitride layer or silicon oxide/nitride layer, which electrically insulates the first and second cantilever electrodes 50A and 50B and the first and second upper word lines 40A and 40B.

Although not shown in these figures, the first and second lower air gaps 90A and 90B and the first and second upper air gaps 92A and 92B are formed by removing first and second sacrificial layers (see sacrificial layers 60 and 70 shown in FIGS. 8A and 12A, respectively) exposed by the trench 100. The first and second lower air gaps 90A and 90B and the first and second upper air gaps 92A and 92B may be spaces in which the ends of the respective first and second cantilever electrodes 50A and 50B move in a third direction perpendicular to the substrate 10, for example, moving in a direction to the first and second upper word lines 40A and 40B, or moving in a direction to the first and second lower word lines 30A and 30B.

Accordingly, the multi-bit electro-mechanical memory device according to the embodiment of the present invention comprises a unit cell 104 that includes first and second memory units 102A and 102B having inner walls that are isolated from each other by the trench 100. Further, the first and second memory units 102A and 102B, in the first direction, are adjacent to each other, and electrically share a common bit line 20. The first and second memory units 102A and 102B of respective unit cells 104, in the second direction, are adjacent to each other, and can electrically share a first or second word line 30A or 30B, and a first or second upper word line 40A or 40B, respectively.

Therefore, in some embodiments, since the multi-bit electromechanical memory device includes the unit cell 104 that is divided into the first and second memory units 102A and 102B, this results in the first and second cantilever electrodes 50A and 50B, respectively, to be isolated from each other around the trench 100, permitting the first and second cantilever electrodes 50A and 50B to individually and independently perform switching operations. Therefore, two or more bits of data per unit cell 104 can be input or output during an operation.

Further, each of the first and second lower word lines 30A and 30B, to which electrical signals are applied to allow the first and second cantilever electrodes 50A and 50B to be switched, is made of a conductive metallic material with a resistance lower than the conventional poly-silicon material, thereby reducing power consumption. For this reason, productivity and power efficiency can be enhanced or maximized.

Figure 4:
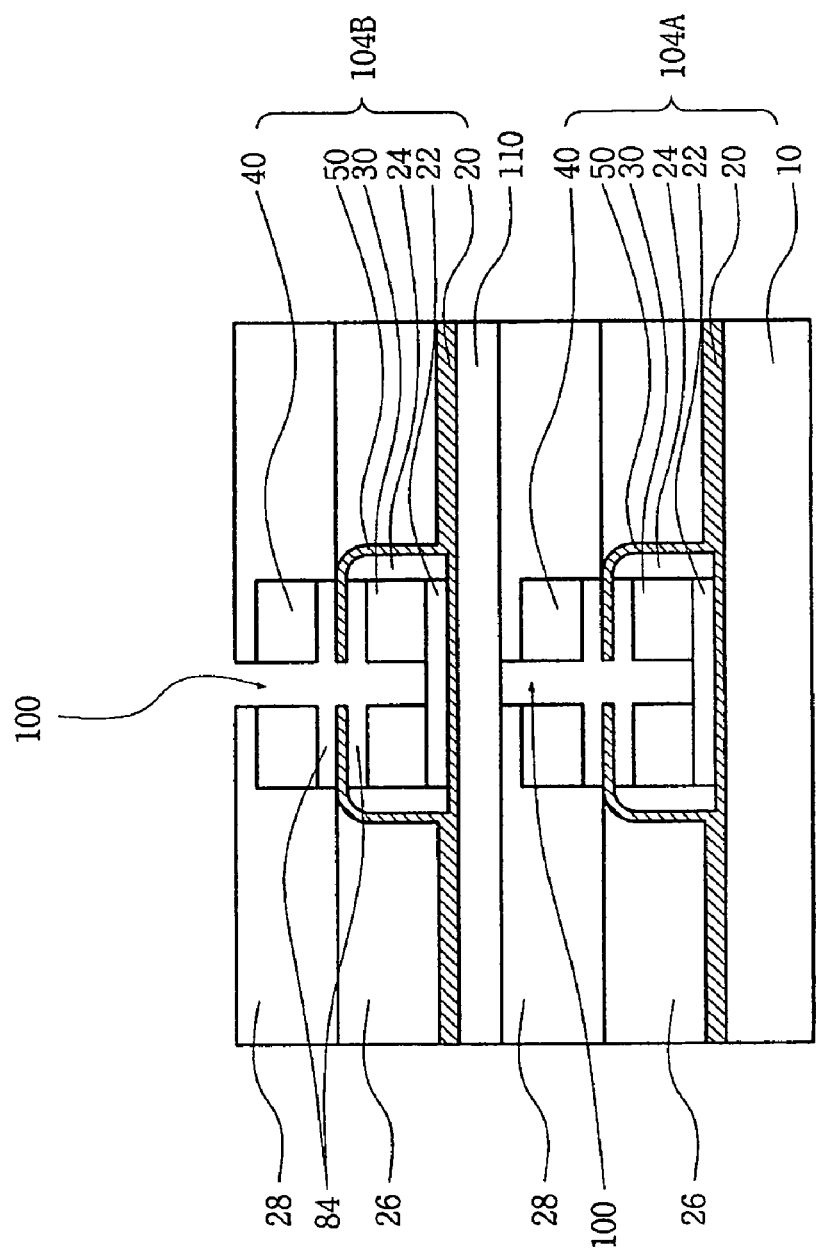
FIG. 4 is a cross-sectional view illustrating a structure having multi-bit electro-mechanical memory devices of FIG. 3 stacked therein according to an embodiment of the present invention.

FIG. 4 is a cross-sectional view illustrating a structure that includes a plurality of multi-bit electro-mechanical memory devices illustrated in FIG. 3 stacked therein. In an embodiment, a multi-bit electro-mechanical memory device can be formed to have a structure in which a fourth interlayer dielectric layer 110 is positioned between first and second unit cells 104A and 104B, such that the fourth interlayer dielectric layer 110 is formed on a top surface of the first unit cell 104A, and the second unit cell 104B is formed on the fourth interlayer dielectric layer 110. In an embodiment, each of the first and second unit cells 104A, 104B comprises a trench 100 and air gap regions 84 extending from the trench 100, the air gap regions 84 positioned between each cantilever electrode 50 and an upper word line 40, and between each cantilever electrode and a lower word line 30. In this manner, an interior of the trench 100 and the air gap regions 84 between the cantilever electrodes 50 and the upper and lower word lines 30, 40 can be in a vacuum state, such that cantilever electrodes 50 can be moved above and below. Alternatively, the trench 100 may be filled with a non-reactive gas such as $N_2$ or Ar gas. The fourth interlayer dielectric layer 110 is formed to cover the top of the first unit cell 104A such that the first and second unit cells 104A and 104B are divided; however, the fourth interlayer dielectric layer 110 is preferably formed not to flow into an interior of an air gap through the trench 100. In an embodiment, the fourth interlayer dielectric layer 110 includes a polymer material formed on a top surface of a third interlayer dielectric layer 28 at an upper portion of the trench 100 of the first unit cell 104A. Although not shown in this figure, in an embodiment, bit lines 20 of the first and second unit cells 104A and 104B may be formed to have different directions with respect to each other. In another embodiment, the trenches 100 of the first and second unit cells 104A and 104B may be formed to be out of line with each other, for example, when stacked on each other.

Accordingly, the multi-bit electro-mechanical memory device of an embodiment may be formed to have a structure in which the second unit cell 104B is stacked on the top surface of the fourth interlayer dielectric layer 110 of the first unit cell 104A formed on a top surface of a substrate 10. As a result, a degree of integration of the memory device can be enhanced or maximized.

A method of operating the multi-bit electro-mechanical memory device configured according to an embodiment will now be described. In this embodiment, first and second lower word lines 30A and 30B, first and second cantilever electrodes 50A and 50B, first and second upper word lines 40A and 40B, and the first and second spacers 24A and 24B may be respectively described as lower word lines 30, cantilever electrodes 50, upper word lines 40 and spacers 24. Their reference numerals may also be used together. Further, first and second lower air gaps 90A and 90B, and first and second upper air gaps 92A and 92B may be respectively described as lower air gaps 90 and upper air gaps 92. As shown in FIG. 4, both the lower and upper air gaps 90 and 92 may be referred to as air gaps 84.

In the multi-bit electro-mechanical memory device according to the embodiment, predetermined data may be programmed, deleted, recorded and read depending on a position of the cantilever electrode 50. For example, an end of the cantilever electrode 50 is bent in a third direction substantially perpendicular to the substrate 10 due to an electric field induced in the air gap 84. In this manner, the cantilever electrode 50 is in contact with either the lower word line 30 that is below the cantilever electrode 50 or the upper word line 40 that is above the cantilever electrode 50. Further, the end of the cantilever electrode 50, when in a horizontal state between the lower and upper word lines 30 and 40, can be at a height identical or similar to an upper surface of the second interlayer dielectric layer 26.

Accordingly, since different voltages that are applied to the bit line 20, the lower word line 30 and the upper word line 40 are controlled, respectively, the programming, deleting, recording and reading of each of the first and second memory units 102A and 102B constituting the unit cell 104 can be performed. For example, a first predetermined voltage can be independently applied to the first and second lower word lines 30A and 30B, and a different, second predetermined voltage can be independently applied to the first and second upper word lines 40A and 40B. Therefore, states of the first and second memory units 102A and 102B may be programmed as "1" or "0" to be identical with each other, or may be respectively programmed as "1" and "0" to be different from each other at the same time. Thus, in the unit cell 104 of the multi-bit electro-mechanical memory device according to the embodiment, data capable of being input/output from the respective first and second memory units 102A and 102B can be combined. At this time, since the first and second memory units 102A and 102B electrically share one bit line 20, the programming and read operations for the respective states cannot be simultaneously performed, and any one of the first and second memory units 102A and 102B should electrically occupy the bit line 20 at a predetermined time.

Accordingly, in the multi-bit electro-mechanical memory device according to the embodiment of the invention, 2-bit data can be input/output in/from a single cell including the first and second memory units 102A and 102B, which are symmetrically positioned at both sides around the trench 100 and programmed to respectively have states that are the same as, or different from, each other.

As described above, the cantilever electrode 50 is made of a shape memory alloy such that the cantilever electrode 50 is deformed to come into contact with the lower word line 30 or the upper word line 40 due to an electrostatic force induced between the lower word line 30 and the cantilever electrode 50, and, when heated by a current or voltage with a predetermined intensity applied through the cantilever electrode 50, the cantilever electrode 50 is restored to its original shape, for example, a horizontal position. For example, if charges with different polarities are applied to the lower word line 30 and the cantilever electrode 50, the cantilever electrode 50 may become deformed (see, for example, FIG. 5B) to be moved toward a direction of the lower word line 30 due to the electrostatic force pursuant to Coulomb's law, the electrostatic force sufficient for the cantilever electrode 50 to electrically contacts the lower word line 30. When the cantilever electrode 50 and the lower word line 30 come into contact with each other, the cantilever electrode 50 and the lower word line 30 are not spaced apart from each other even though a charge is applied to the cantilever electrode 50 and the lower word line 30 do not exist any more. This is because the cantilever electrode 50 is already deformed while being bent to a direction of the lower word line 30. Moreover, since each of the cantilever electrode 50 and the lower word line 30 is made of a metallic material with superior conductivity, a state where the cantilever electrode 50 and the lower word line 30 electrically come into contact with each other can be continuously maintained due to the reaction of a Van der Waals' force, that is, a metal bonding force.

On the other hand, when a current or voltage with a predetermined intensity is applied to the cantilever electrode 50 that is electrically connected to the lower word line 30, the cantilever electrode 50, when heated, can be restored to an original state, and be isolated from the lower word line 30, due to resilience properties of the shape memory alloy, which is generated at a predetermined temperature, or higher. For example, the shape memory effect mechanism of a shape memory alloy is the same phenomenon as martensite crystal transformation, that is, a form of phase transformation in a solid-phase state of metal. As a result of research and development performed on the shape memory alloy, it has been found that alloys involving a thermoelasticity martensite crystal transformation have a property of remembering a shape without exception. At this time, the resilience of the shape memory alloy can overcome electrostatic and van der Waals' forces that can occur between the cantilever electrode 50 and the lower word line 30.

Figure 5A:
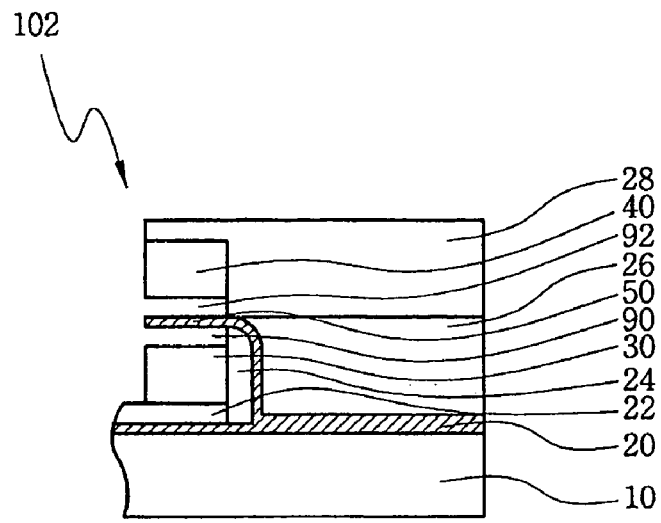
FIGS. 5A and 5B are cross-sectional views illustrating a program or read operation of a multi-bit electro-mechanical memory device according to an embodiment of the present invention.
Figure 5B:
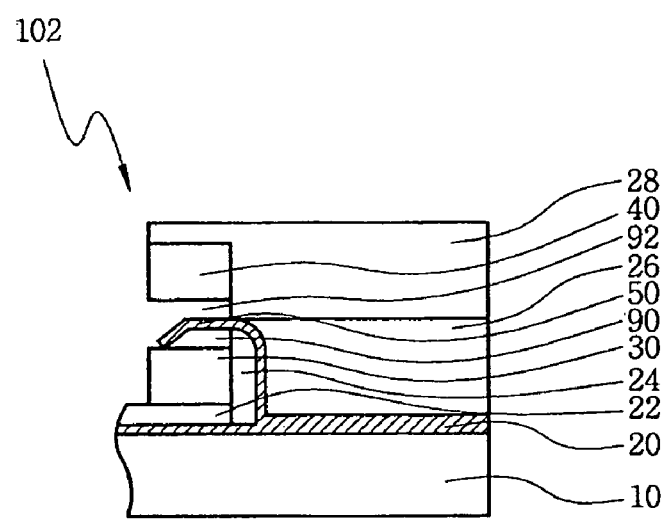

Accordingly, in the multi-bit electro-mechanical memory device according to the embodiment described herein, for example, as shown in FIG. 5B, each of the plurality of cantilever electrodes 50 isolated by the trench 100 formed in a direction intersecting the lower word line 30 can electrically come into contact with the lower word line 30 while being moved to a direction of the lower word line 30 due to an electrostatic force induced by the lower word line 30 in the air gap 84. The lower word line 30 and the cantilever electrode 50 are isolated from each other by applying a current and voltage with a predetermined intensity to the lower word line 30 and the cantilever electrode 50, which electrically come into contact with each other. Therefore, it is possible to reduce the length of the cantilever electrode 50 as compared to conventional memory devices. Further, unlike conventional memory devices, it is not required to individually fabricate a portion electrically coming into contact with the cantilever electrode 50 and a portion drawing the cantilever electrode 50. For this reason, a degree of integration of the memory device can be enhanced or maximized.

FIGS. 5A and 5B are cross-sectional views illustrating a program or read operation of a multi-bit electro-mechanical memory device according to an embodiment of the invention.

As shown in FIG. 5A, when programming data corresponding to "0" in the multi-bit electro-mechanical memory device of the invention, a predetermined first voltage (e.g., $V_{pull-in}$) is applied between a cantilever electrode 50 and a lower word line 30 such that the cantilever electrode 50 changes shape, and is deformed in a direction of the lower word line 30, until the lower word line 30 and the cantilever electrode 50 are electrically connected to each other. At this time, current does not flow before the lower word line 30 and the cantilever electrode 50 are electrically connected to each other. Programming data corresponding to "0" may be referred to as a program. Thus, the cantilever electrode 50 is deformed to be electrically connected to the lower word line 30 by applying a first voltage with a predetermined intensity between a bit line 20 and the lower word line 30, so that data corresponding to "0" can be programmed. If an electrical signal of a second voltage having a level lower than the first voltage is applied to the bit line 20 when reading data corresponding to "0", the electrical signal of the second voltage can be output through the lower word line 30 because the cantilever electrode 50 is electrically connected to the lower word line 30.

As shown in FIG. 5B, when programming data corresponding to "1", a current with a predetermined intensity and a third voltage (e.g., $V_{pull-out}$) having a level lower than the first voltage are applied between the cantilever electrode 50 and the lower word line 30 such that the cantilever electrode 50 and the lower word line 30 are isolated from each other. As described above, the cantilever electrode 50 can be isolated from the lower word line 30 while being heated by the current. Programming data corresponding to "1" may be referred to as an erase. If an electrical signal of the second voltage having a level lower than the first and third voltages is applied to the bit line 20 when reading data corresponding to "1", the electrical signal of the second voltage cannot be output through the lower word line 30 because the cantilever electrode 50 is electrically isolated from the lower word line 30.

Accordingly, in the multi-bit electro-mechanical memory device according to the embodiment of the invention, information of "0" or "1" can be stored, or written, to correspond to a state that the cantilever electrode 50 and the lower word line 30 are electrically connected to each other or isolated from each other. Further, information of "0" or "1" can be read, depending on the level of an electrical signal corresponding to the state that the cantilever electrode 50 and the lower word line 30 are electrically connected to each other or isolated from each other.

Figure 6:
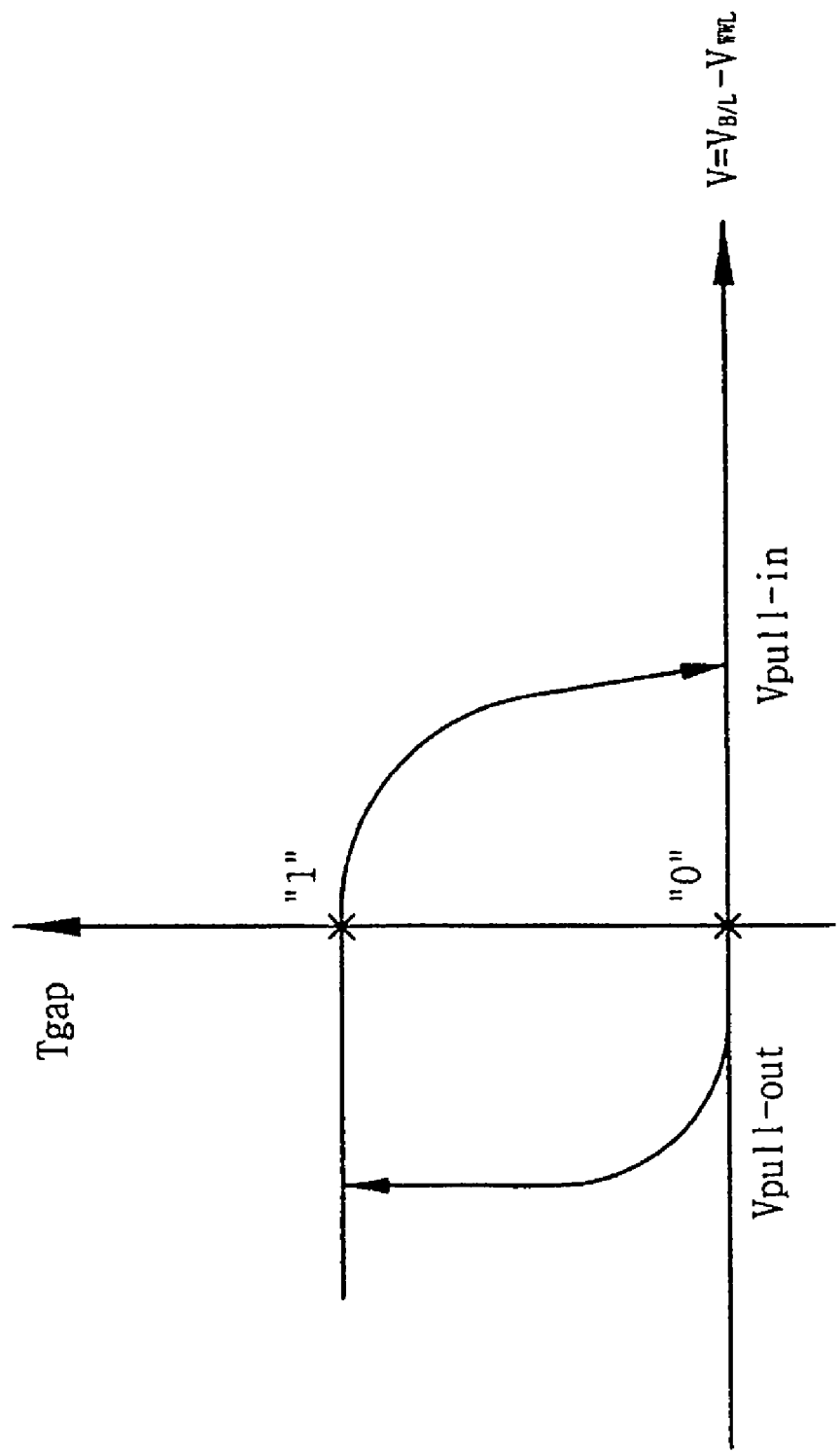
FIG. 6 is a graph illustrating a relation between a bending distance of a cantilever electrode and a voltage applied through a bit line and a lower word line of a multi-bit electro-mechanical memory device according to an embodiment of the present invention.

FIG. 6 is a graph illustrating a relation between a bending distance of a cantilever electrode 50 and a voltage applied through a bit line 20 and a lower word line 30 of a multi-bit electro-mechanical memory device according to an embodiment of the invention. When a voltage of "$V_{pull-in}$" having a positive value sufficient to move the cantilever electrode 50 is applied between the bit line 20 and the lower word line 30, the cantilever electrode 50 moves toward the lower word line 30 until the cantilever electrode 50 and the lower word line 30 come into contact with each other, so that data corresponding to "0" can be programmed. When a voltage of "$V_{pull-out}$" having a negative value sufficient to move the cantilever electrode 50 upward, away from the lower word line 30, is applied between the bit line 20 and the lower word line 30, the cantilever electrode 50 and the lower word line 30 are isolated from each other, so that data corresponding to "1" can be programmed. Although not shown in this figure, a current with a predetermined intensity, or a higher current, can be applied such that the cantilever electrode 50 and the lower word line 30, which are electrically connected to each other, are isolated from each other. As described above, the shape memory alloy of the cantilever electrode 50 is self-heated due to Joule heat in proportion to the square of the current, resulting in the cantilever electrode 50 being isolated from the lower word line 30.

In FIG. 6, the horizontal axis indicates an amplitude of a voltage, and the vertical axis indicates a distance Tgap at which the cantilever electrode 50 moves from a surface of a trap site to an upper word line 40. Thus, when a voltage of "$V_{pull-in}$" having a positive value or a voltage of "$V_{pull-out}$" having a negative value is applied between the cantilever electrode 50 and the lower word line 30, which are connected to the bit line 20, the cantilever electrode 50 comes into contact with or is isolated from the trap site on the lower word line 30, so that digital data corresponding to 1 bit having a value of "0" or "1" can be programmed.

At this time, the voltages of "$V_{pull-in}$" and "$V_{pull-out}$" may be determined by the following expression:

$$V = V_{B/L} - V_{WWL}$$

Here, the "V" denotes a voltage of "$V_{pull-in}$" or "$V_{pull-out}$", "$V_{B/L}$" denotes a voltage applied to the bit line 20, and "$V_{WWL}$" denotes a voltage applied to the lower word line 30. At this time, the voltage of "$V_{pull-in}$" has a positive value, and the voltage of "$V_{pull-out}$" has a negative value. For example, it is assumed that the absolute values of the voltages of "$V_{pull-in}$" and "$V_{pull-out}$" are identical or similar to each other. When programming data corresponding to "0", voltages of $\frac{1}{2} * "V_{pull-in}"$ and $\frac{1}{2} * "V_{pull-out}"$ are respectively applied to the bit line 20 and the lower word line 30, so that the cantilever electrode 50 and the lower word line 30 can electrically come into contact with each other.

When programming data corresponding to "1", voltages of $\frac{1}{2} * "V_{pull-out}"$ and $\frac{1}{2} * "V_{pull-in}"$ are respectively applied to the bit line 20 and the lower word line 30, so that the cantilever electrode 50 and the lower word line 30 are isolated from each other. Although not shown in this figure, each of the bit line 20, the lower word line 30 and the upper word line 40, to which the voltage of "$V_{pull-in}$" or "$V_{pull-out}$" is not applied, may be set to have a grounded state.

Hereinafter, a method of manufacturing the multi-bit electro-mechanical memory device configured in such a manner according to an embodiment of the present invention will be described.

FIGS. 7A through 16B are perspective and cross-sectional views illustrating a method of manufacturing the multi-bit electro-mechanical memory device of FIGS. 2 and 3. Here, FIGS. 7B, 8B, ... 16B are cross-sectional views sequentially taken along lines I-I' in perspective views of FIGS. 7A, 8A, ... 16A, respectively.

Figure 7A:
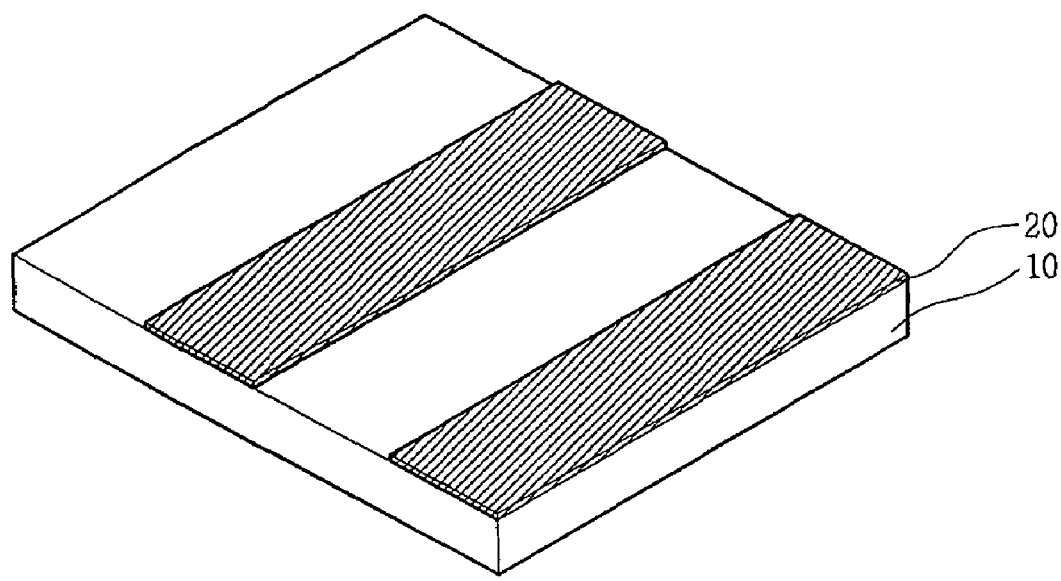
FIGS. 7A through 16B are perspective and cross-sectional views illustrating a method of manufacturing the multi-bit electro-mechanical memory device of FIGS. 2 and 3 according to embodiments of the present invention.
Figure 7B:
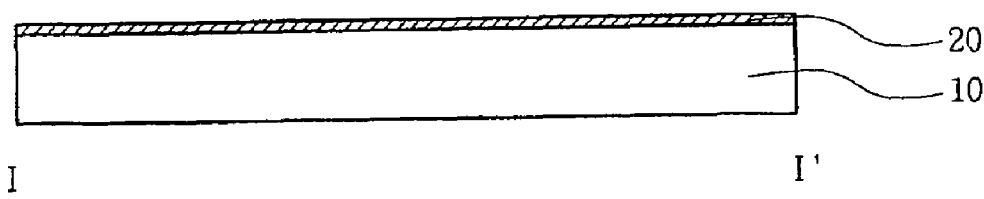

As shown in FIGS. 7A and 7B, a plurality of bit lines 20 having a predetermined thickness are formed in a first direction on a substrate 10 that is along a horizontal plane. Here, the plurality of bit lines 20 on the substrate 10 are parallel with each other in the first direction. In an embodiment, each bit line 20 includes at least one of a crystal-silicon or poly-silicon layer doped with conductive impurities and a conductive metal layer comprising a metal such as gold, silver, copper, aluminum, tungsten, tungsten silicide, titanium, nitride titanium, tantalum or tantalum silicide, which is formed by a physical or chemical vapor deposition method. Although not shown in these figures, the bit lines 20 may be formed by being anisotropically etched via a dry etching method using either a photoresist pattern or a first hard mask layer as an etching mask, the photoresist pattern or first hard mask layer screening the bit line 20 to have a predetermined line width on the conductive metal layer or poly-silicon layer, such that the bit lines 20 have a predetermined thickness on a surface of the substrate 10. For example, reactive gas used in the dry etching method of the conductive metal layer or poly-silicon layer includes a sufficiently strong acid gas in which sulphuric acid and nitric acid are mixed, resulting in the bit line 20 being formed to have a thickness of about 200 Å and a line width of about 50 Å.

Figure 8A:
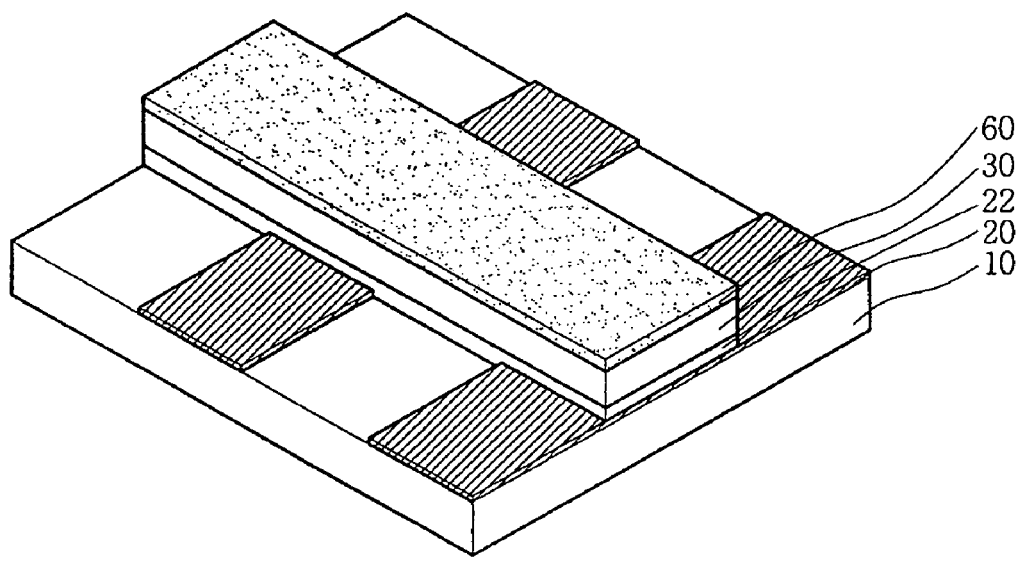
Figure 8B:
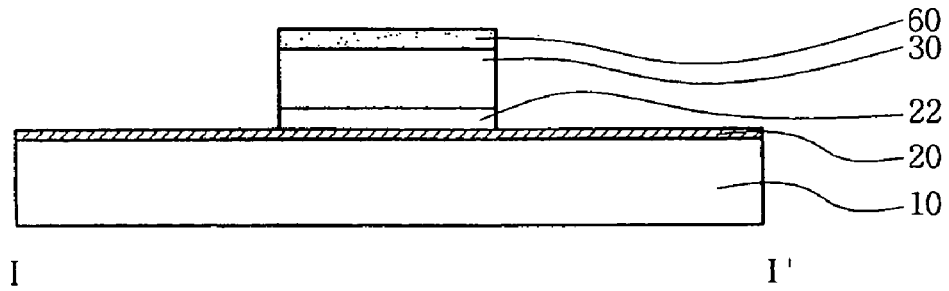

As shown in FIGS. 8A and 8B, a first interlayer dielectric layer, a lower word line, and a first sacrificial layer, each having a predetermined line width, are formed in a second direction intersecting the bit lines 20 in the first direction. The first interlayer dielectric layer, the lower word line, and the first sacrificial layer are formed on each other in a stacked configuration. A stack comprising a patterned first interlayer dielectric layer 22, lower word line 30 and first sacrificial layer 60 are formed by anisotropically etching via a dry etching method the first interlayer dielectric layer, lower word line, and first sacrificial layer, by forming using a photoresist pattern on the first sacrificial layer as an etching mask. The patterned first interlayer dielectric layer 22, also referred to as the first interlayer dielectric layer 22, can include a silicon oxide layer or silicon nitride layer. The first interlayer dielectric layer 22 can have a thickness of about 150 to 200 Å, and can be formed by a chemical vapor deposition method. At this time, the patterned first interlayer dielectric layer 22, can serve as an etching stop layer in a subsequent process of forming a trench 100 (shown, for example, in FIGS. 15A-15B), which divides the lower word line 30 into two parts in a lateral direction. The lower word line 30 is a conductive metal layer having superior conductivity properties, the word line 30 comprising metals such as gold, silver, copper, aluminum, tungsten, tungsten silicide, titanium, nitride titanium, tantalum or tantalum silicide, or alloys thereof. The lower word line 30 can have a thickness of about 200 Å, and can be formed by a physical or chemical vapor deposition method. The first sacrificial layer 60 includes a poly-silicon layer having a thickness of about 30 to 50 Å, and can be formed by an atom layer deposition or chemical vapor deposition method. Each of the first sacrificial layer 60, the lower word line 30 and the first interlayer dielectric layer 22 can have a line width of about 50 Å. Fluorocarbon-based gas such as $C_xF_y$ based or $C_aH_bF_c$ based gas can be used as a reactive gas to perform a dry etching method for patterning the first sacrificial layer 60, the lower word line 30 and the first interlayer dielectric layer 22. The fluorocarbon-based gas may include at least one gas such as $CF_4$, $CHF_3$, $C_2F_6$, $C_4F_8$, $CH_2F_2$, $CH_3F$, $CH_4$, $C_2H_2$, $C_4F_6$ or the like, or a mixed gas thereof.

Figure 9A:
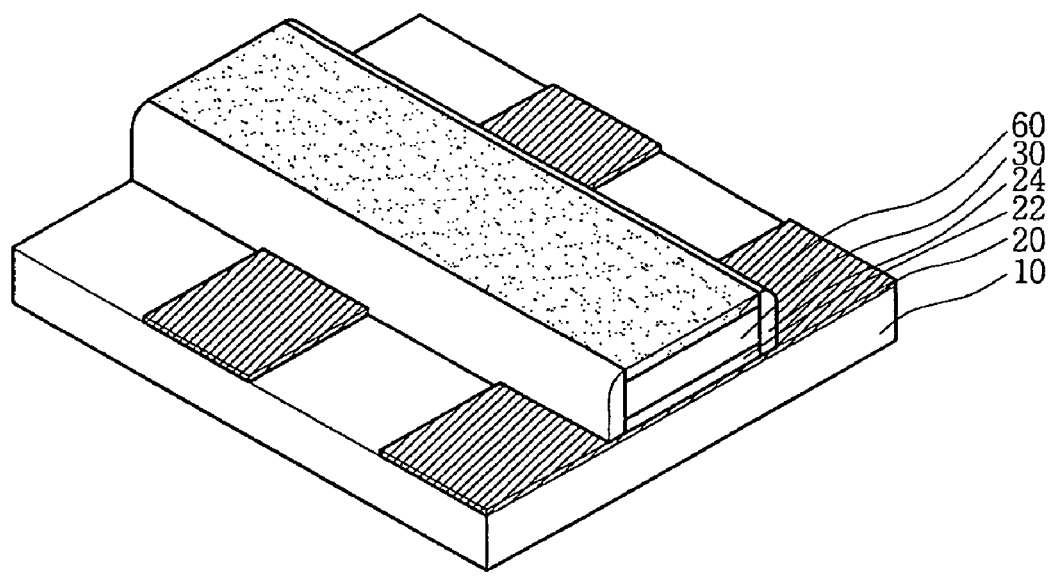
Figure 9B:
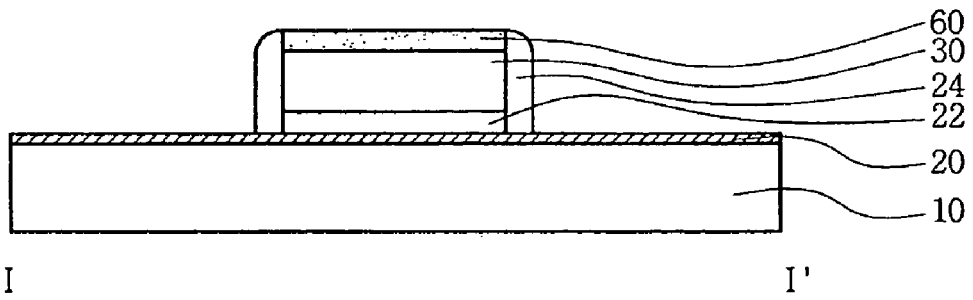

As shown in FIGS. 9A and 9B, a spacer 24 is formed on at least one sidewall of the stack, which includes the patterned first interlayer dielectric layer 22, the patterned lower word line 30 and the patterned first sacrificial layer 60. Here, the spacer 24 is selectively formed on the sidewall of the stack including the first interlayer dielectric layer 22, the lower word line 30 and the first sacrificial layer 60, which is formed to have a predetermined step difference on the substrate 10. In this manner, a cantilever electrode 50 that is subsequently formed can be insulated from the lower word line 30. The spacer 24 includes a silicon nitride layer or poly-silicon layer formed through a chemical vapor deposition method. The spacer 24 can be formed by forming a silicon nitride layer or poly-silicon layer with a uniform thickness over the entire surface of the substrate having the stack and then anisotropically etching the silicon nitride layer or the poly-silicon layer through a dry etching method having excellent vertical etching characteristics, such that the spacer can be self-aligned on the sidewall of the stack. Here, when the spacer 24 comprises a silicon nitride layer, the spacer 24 permits a sidewall of the lower word line and the cantilever electrode 50 to be spaced apart from each other at a predetermined distance. On the other hand, when the spacer 24 comprises a poly-silicon layer, the spacer 24 can be removed together with the first sacrificial layer 60 in a subsequent process such that an air gap is formed.

Thus, when the spacer 24 is made of the poly-silicon layer, the spacer 24 can be formed by the same process, and formed of the same material, poly-silicon, as the first sacrificial layer 60, both the spacer 24 and the first sacrificial layer 60 being formed after the interlayer dielectric layer 22 and the lower word line 30 are formed. For example, the spacer 24 may be formed by: forming the first interlayer dielectric layer 22 and the lower word line 30, which intersect the bit lines 20, then forming the poly-silicon layer on the entire surface of the substrate 10 having the first interlayer dielectric layer 22 and the lower word line 30, then patterning the poly-silicon layer. As a result, the spacer 24 are on sidewalls of the first interlayer dielectric layer 22 and the lower word line 30, and connected to the first sacrificial layer 60 made of the poly-silicon layer, which is formed on the first interlayer dielectric layer 22 and the lower word line 30.

Although not shown in these figures, when forming the bit lines 20, the first hard mask layer formed on the bit lines 20 may be removed by a reactive gas used in a dry etching method when forming the spacer 24. Thus, the bit lines 20 may be exposed during formation of the spacer 24.

Figure 10A:
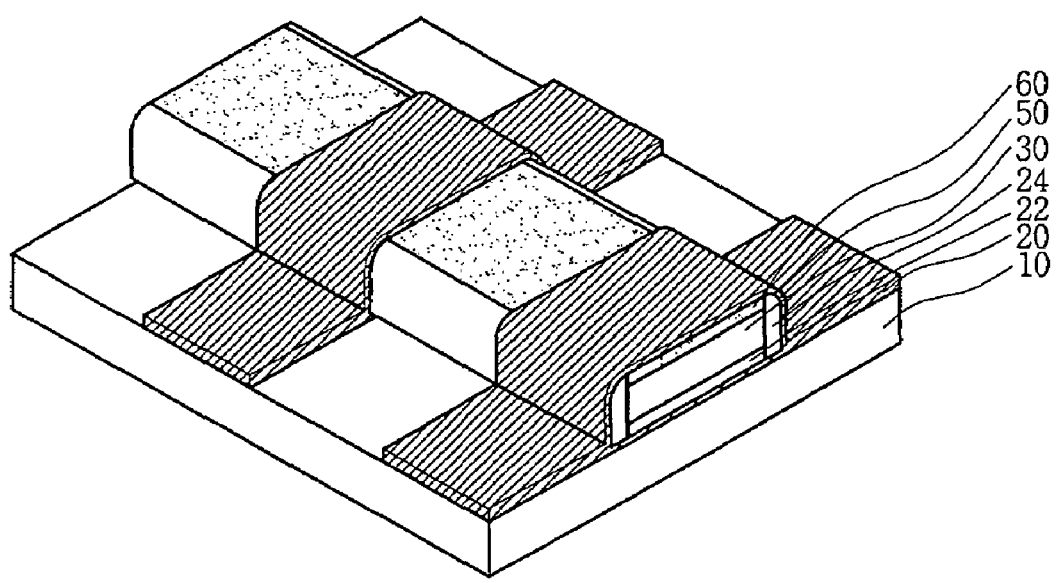
Figure 10B:
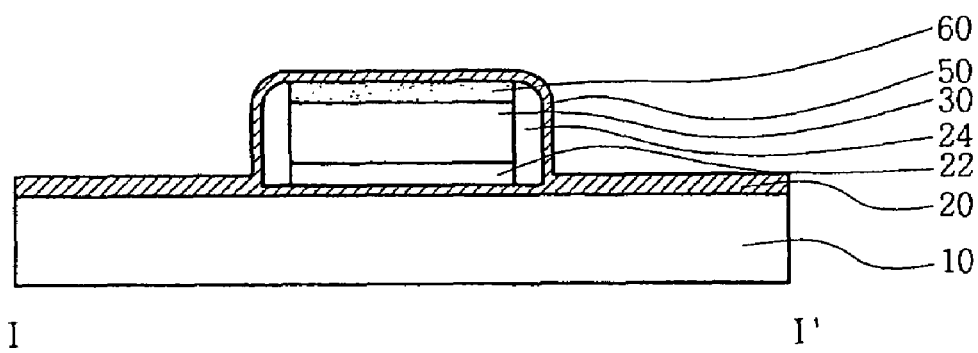

As shown in FIGS. 10A and 10B, a cantilever electrode 50 is electrically connected to the bit line 20, and is adjacent to the spacer 24 abutting a sidewall of the stack. Further, the cantilever electrode is on a top surface of the stack, which includes the first sacrificial layer 60, the lower word line 30 and the first interlayer dielectric layer 22, the stack in the first direction, and on a top surface of each of the bit lines 20. Here, the cantilever electrode 50 is electrically connected to the bit line 20 at both sides of the stack, and is contiguously formed from a first portion of the bit line 20 at a first side of the stack, on the top surface of the stack, to a second portion of the bit line 20 at a second side of the stack. The cantilever electrode 50 can have a line width that is identical or similar to the bit line 20, and can be positioned on the bit line 20 at outer walls of the spacers 24 formed at one or both sides of the stack. In an embodiment, the cantilever electrode 50 is formed by forming a shape memory alloy, such as a TiNi alloy, a Ni—Co—Al alloy, a Ni—Mn—Ga alloy or a Cu—Zn—Al alloy, on the entire surface having the stack and the spacer 24 through a physical or chemical vapor deposition method so as to have a thickness of about 30 to 50 Å, then forming a photoresist pattern or second hard mask layer screening the shape memory alloy on the top surface of the bit line 20, then anisotropically etching the shape memory alloy through a dry etching method using the photoresist pattern or second hard mask layer as an etching mask. At this time, the shape memory alloy may be formed by a physical or chemical vapor deposition method, and may be heated at a predetermined temperature, or higher, before and after patterning the cantilever electrode 50, so as to be thermally stabilized. The second hard mask layer can be removed when patterning the cantilever electrode 50, or the second hard mask layer can remain on the cantilever electrode 50.

Figure 11A:
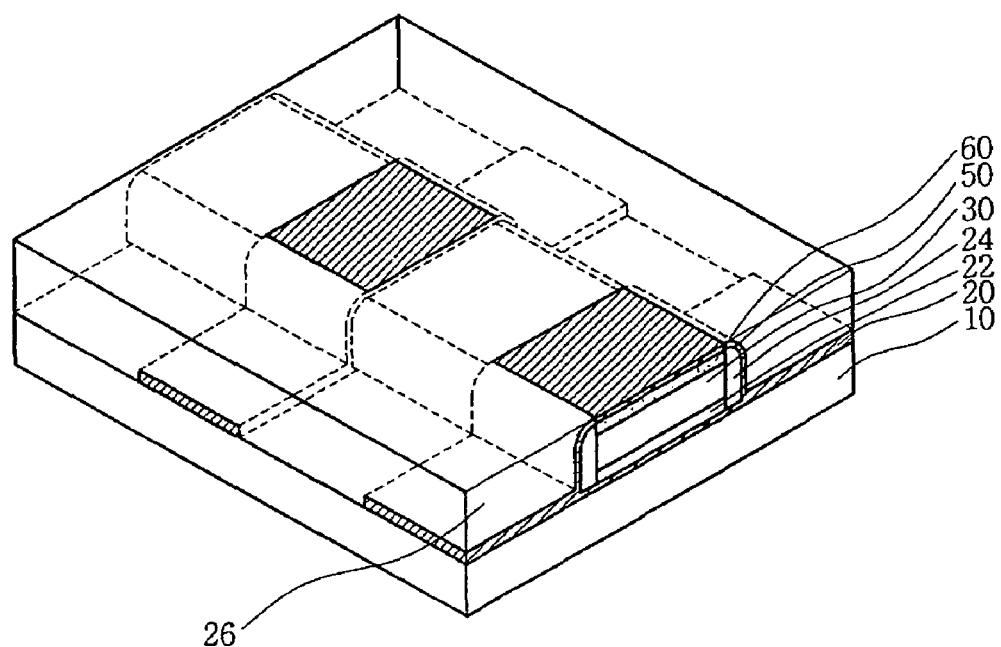
Figure 11B:
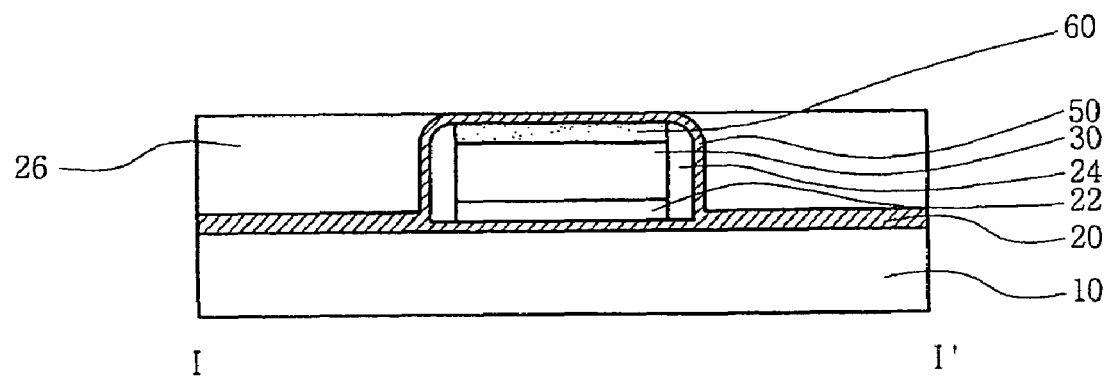

As shown in FIGS. 11A and 11B, a second interlayer dielectric layer 26 with a predetermined thickness is formed on the entire surface of the substrate having the bit lines and then planarized such that the cantilever electrode 50 on the top of the stack is exposed. Here, the second interlayer dielectric layer 26 provides a planarized surface to a top of the cantilever electrode 50 formed on the lower word line 30 and the first sacrificial layer 60, which have a predetermined step difference from the substrate 10, such that a second sacrificial layer 70 and an upper word line 40 can be formed in a direction parallel with the lower word line 30 and the first sacrificial layer 60 in a subsequent process. The second interlayer dielectric layer 26 allows the patterning process of the cantilever electrode 50 and the patterning process of the upper word line 40 to be independently performed. This is because each of the cantilever electrode 50 and the upper word line 40 is made of a conductive metal layer having superior conductivity properties, and because the selective etching ratios of most etchants and reactive gases used in patterning the conductive metal layer are low. Thus, the second interlayer dielectric layer 26 is used to separately form two stacked lines or patterns each formed of a conductive metal layer. For example, the second interlayer dielectric layer 26 comprises a silicon oxide layer formed by a plasma chemical vapor deposition method. At this time, the second interlayer dielectric layer 26 is formed to have a height the same as or higher than a height of the cantilever electrode 50 across the surface of the substrate 10 on which the cantilever electrode 50 and the second hard mask layer are formed. Further, the second interlayer dielectric layer 26 may be planarized by being removed through a chemical mechanical polishing method such that the cantilever electrode 50 on the first sacrificial layer 60 is exposed.

Accordingly, in the method of manufacturing the multi-bit electro-mechanical memory device, in an embodiment, the second interlayer dielectric layer 26 is formed on the entire surface of the substrate 10 having the cantilever electrode 50, and then planarized to allow the cantilever electrode 50 formed on the lower word line 30 and the first sacrificial layer 60 to be exposed, so that the following second sacrificial layer 70 and upper word line 40 can be subsequently formed and patterned.

Figure 12A:
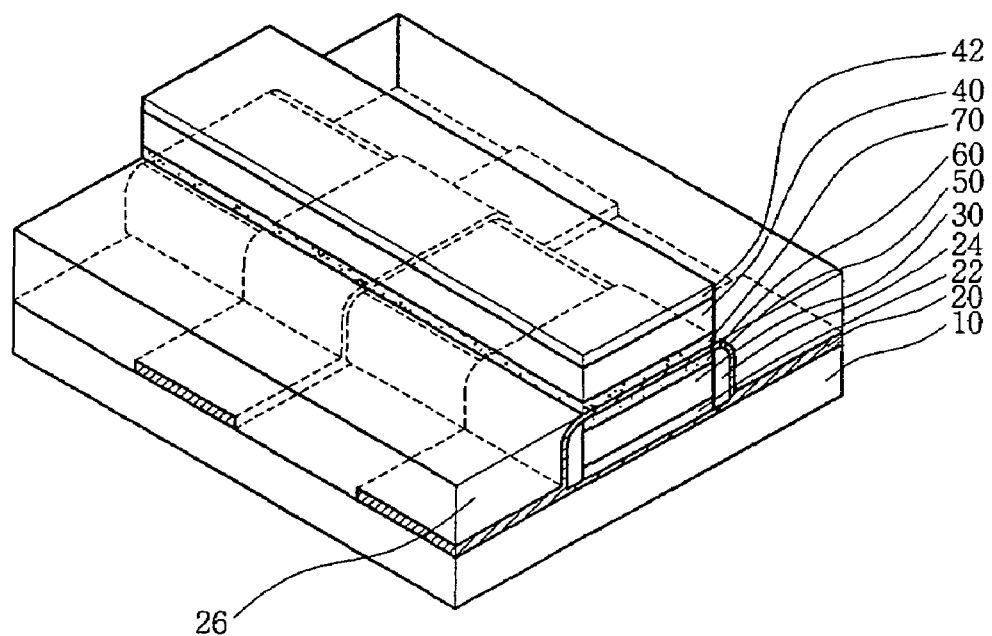
Figure 12B:
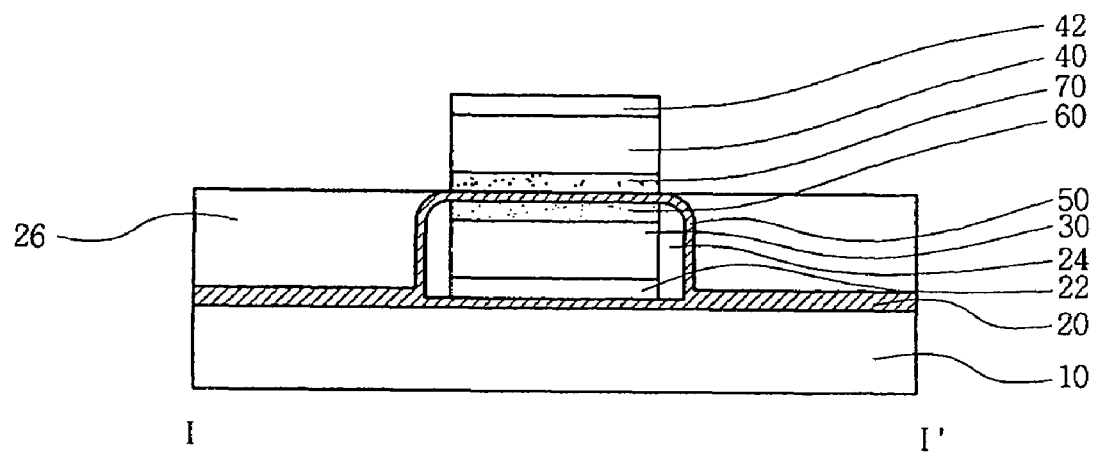

As shown in FIGS. 12A and 12B, the second sacrificial layer 70 and the upper word line 40 are formed in the second direction, and are parallel with the first sacrificial layer 60 and the lower word line 30 on the top surface of the cantilever electrode 50 exposed by the second interlayer dielectric layer 26. Here, the second sacrificial layer 70 and the upper word line 40 above a top portion of the upper cantilever electrode 50 are symmetric with respect to the first sacrificial layer 60 and the lower word line 30 below the top portion of the cantilever electrode 50. In an embodiment, the second sacrificial layer 70 is made of a poly-silicon material formed by an atomic layer deposition or chemical vapor deposition method, and, in this manner, is formed in a similar manner as the first sacrificial layer 60, and is formed having similar dimensions as the first sacrificial layer 60. The second sacrificial layer 70 is formed to have a thickness of about 50 to 150 Å. The upper word line 40 is formed to have a thickness of about 200 Å. In an embodiment, the second sacrificial layer 70 and the upper word line 40 are formed as follows: First, a poly-silicon layer, a conductive metal layer and a third hard mask layer 42, each of which has a predetermined thickness, are stacked on the second interlayer dielectric layer 26 according to a chemical vapor deposition method. Next, a photoresist pattern (not shown) screening the third hard mask layer 42 on the first sacrificial layer 60 and the lower word line is formed. Next, the third hard mask layer 42 is removed through a dry or wet etching method using the photoresist pattern as an etching mask, and the photoresist pattern is then removed through an ashing process. Finally, the poly-silicon layer and the conductive metal layer are anisotropically etched by a dry or wet etching method using the third hard mask layer 42 as an etching mask, thereby forming the second sacrificial layer 70 and the upper word line 40.

Figure 13A:
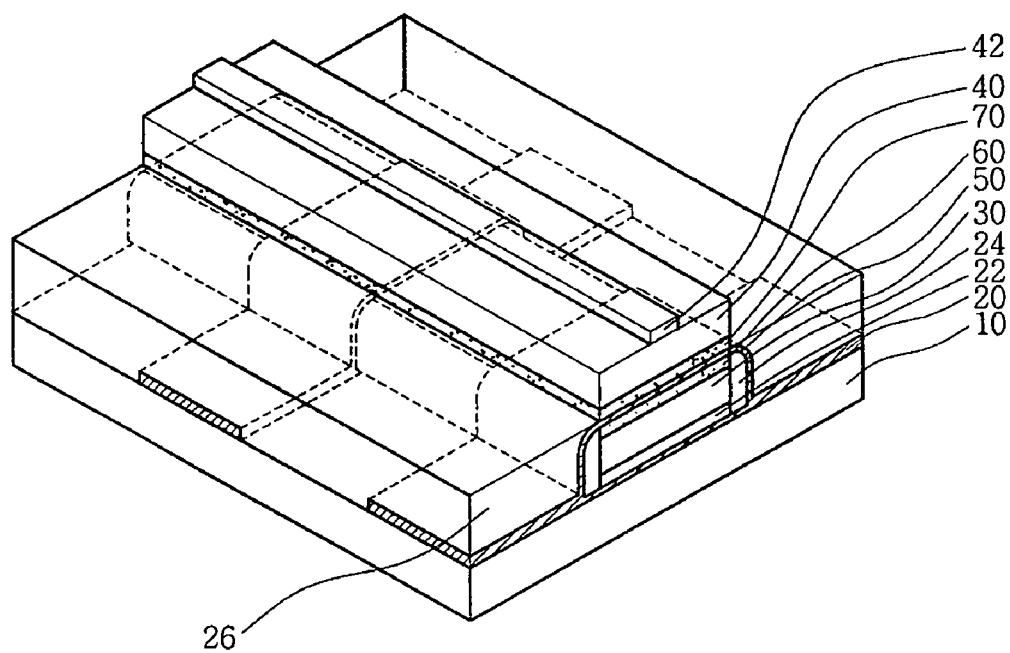
Figure 13B:
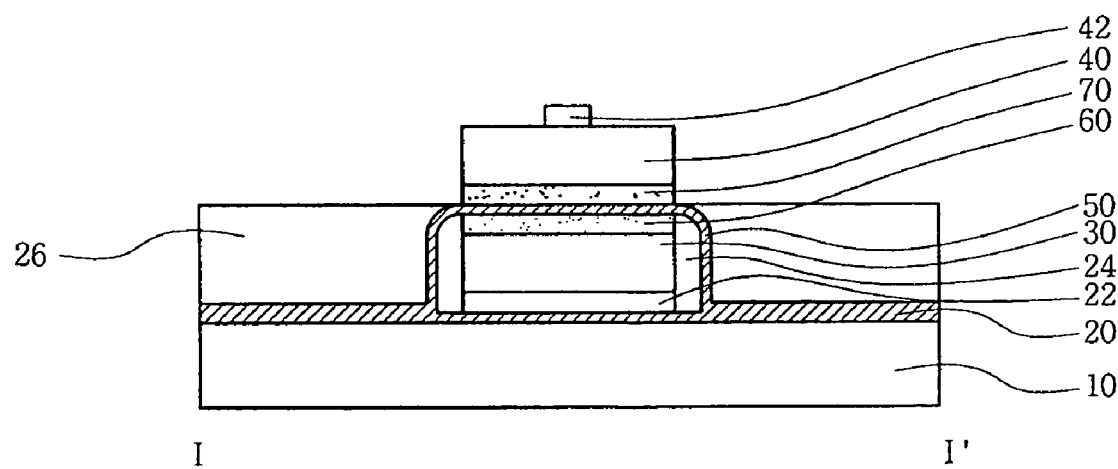

As shown in FIGS. 13A and 13B, the third hard mask layer 42 formed on the upper word line 40 is patterned, wherein a width of the third hard mask layer 42 is reduced to a predetermined line width. Here, the patterned third hard mask layer 42 defines the line width of trench in a subsequent process. In an embodiment, the third hard mask layer 42 is patterned by forming a photoresist pattern on the third hard mask layer 42, and anisotropically etching the third hard mask layer 42 by a dry or wet etching method using a photoresist pattern to screen a center portion of the upper word line 40 in the second direction. Here, the photoresist pattern is formed in one direction as an etching mask such that the line width of the third hard mask layer 42 is reduced. Further, the third hard mask layer 42 can be formed by being isotropically etched by a dry or wet etching method, wherein the method has an etching characteristic in a vertical direction that is superior to that in a horizontal direction. As a result, the line width of the third hard mask layer 42 is reduced. Further, a reactive gas or etchant used in the isotropic dry or wet etching method may selectively etch a side surface of the third hard mask layer 42 while the gas or etchant flows in a direction parallel with the substrate 10.

Figure 14A:
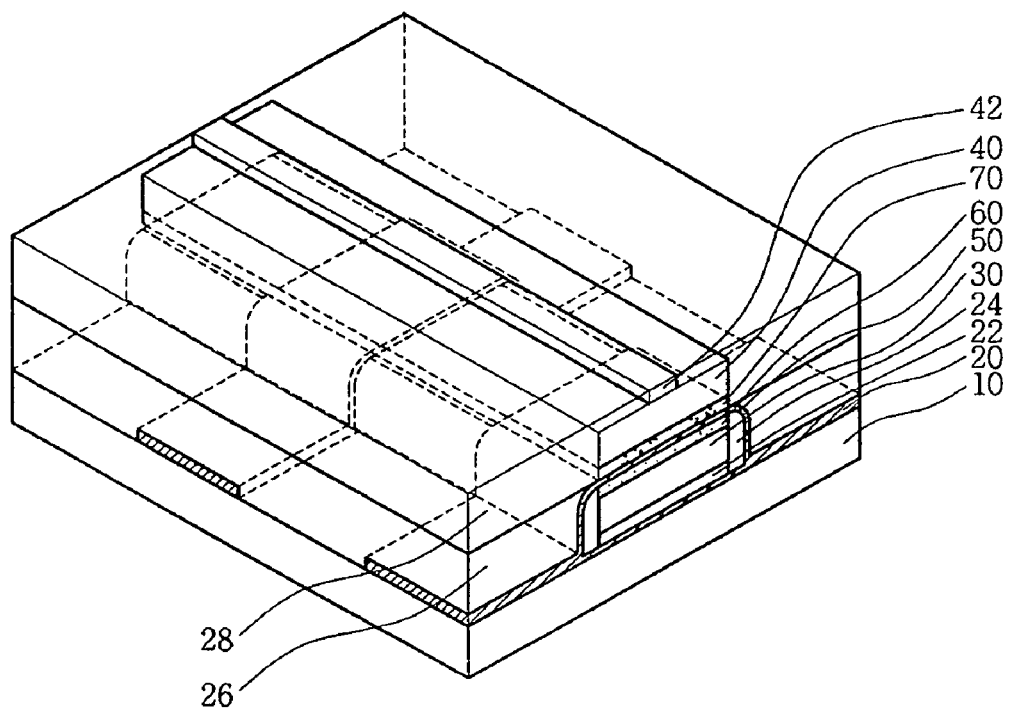
Figure 14B:
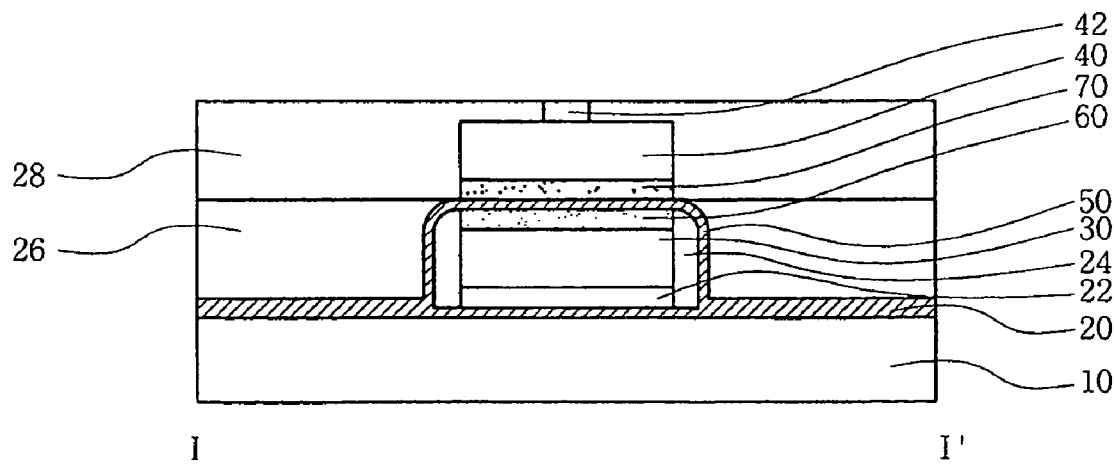

As shown in FIGS. 14A and 14B, a third interlayer dielectric layer 28 having a predetermined thickness is formed on the third hard mask layer 42 having a reduced line width. The third interlayer dielectric layer 28 is then planarized such that a surface of the third hard mask layer 42 is exposed. Here, the third interlayer dielectric layer 28 has a thickness that is greater than a thickness of at least one of the second sacrificial layer 70 and the upper word line 40. Thus, the third interlayer dielectric layer 28 provides support to the side surfaces of the upper word line 40 when the second sacrificial layer 70 is removed, so that the upper word line 40 can be above the cantilever electrode 50 with an air gap interposed therebetween. In an embodiment, the third interlayer dielectric layer 28 includes a silicon oxide layer formed by a plasma vapor deposition method. Further, the third interlayer dielectric layer 28 may be planarized by a chemical mechanical polishing method. When the third interlayer dielectric layer 28 is planarized using the upper word line 40 as a polishing stop layer, the upper word line 40, in particular, the upper word line composed of a conductive metal layer, may become damaged. Therefore, the third hard mask layer 42 is preferably used as a polishing stop layer.

Although not shown in the figures illustrated herein, if a process of reducing the line width of the third hard mask layer 42 is omitted, the third interlayer dielectric layer 28 with a predetermined thickness can be formed on the top surface of the third hard mask layer 42 and then planarized such that the third hard mask layer 42 is exposed. If the third interlayer dielectric layer 28 is removed when forming the second sacrificial layer 70 and the upper word line 40, the third interlayer dielectric layer 28 with a predetermined thickness may be formed on the entire surface of the substrate 10 having the upper word line 40 and then planarized for a predetermined time. At this time, the third interlayer dielectric layer 28 with a predetermined thickness can remain on the top surface of the upper word line 40 when planarizing the third interlayer dielectric layer 28, or the upper word line may be exposed.

Figure 15A:
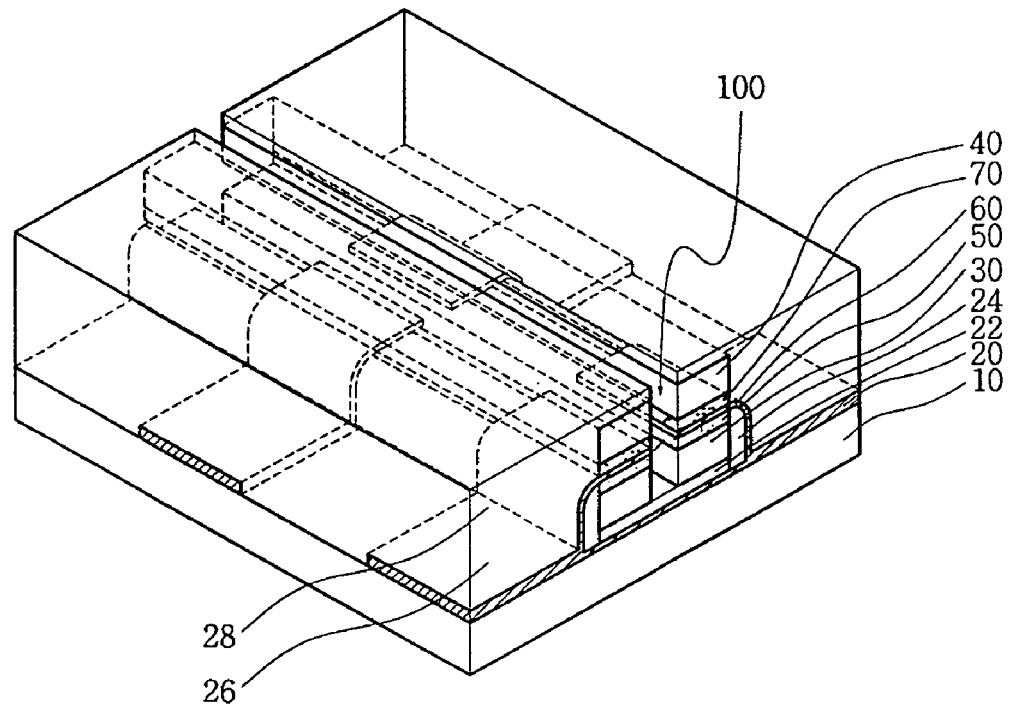
Figure 15B:
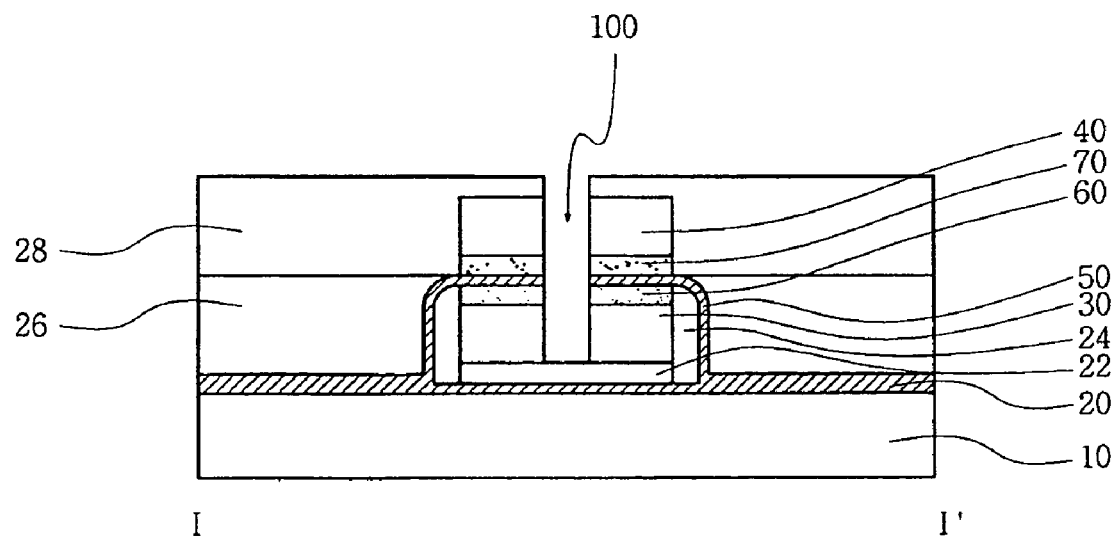

As shown in FIGS. 15A and 15B, a trench 100 exposing the first interlayer dielectric layer 22 at a bottom of the trench 100 is formed by sequentially and anisotropically etching the third hard mask layer 42, the upper word line 40, the second sacrificial layer 70, the cantilever electrode 50, the first sacrificial layer 60 and the lower word line 30. The trench 100 is formed by a dry etching method using the third interlayer dielectric layer 28 as an etching mask. Here, the trench 100 is formed such that each of the upper word line 40, the second sacrificial layer 70, the cantilever electrode 50, the first sacrificial layer 60 and the lower word line 30 is symmetrically divided into a plurality of upper word lines 40, second sacrificial layers 70, cantilever electrodes 50, first sacrificial layers 60 and lower word lines 30. The trench 100 can be formed by a dry etching method, using the third interlayer dielectric layer 28 made of a silicon oxide layer and a reactive gas having a high selective etching ratio. The trench is preferably formed to the first interlayer dielectric layer 22, or a poly-silicon layer or conductive metal layer corresponding to the first interlayer dielectric layer 22. In an embodiment, a fluorocarbon-based gas such as $C_xF_y$ based or $C_aH_bF_c$ based gas may be used as the reactive gas. The fluorocarbon based gas can include gas such as $CF_4$, $CHF_3$, $C_2F_6$, $C_4F_8$, $CH_2F_2$, $CH_3F$, $CH_4$, $C_2H_2$, $C_4F_6$ or the like, or mixed gas thereof. When the width of the trench 100 is reduced, interference can occur among the lower word line 30, the upper word line 40 and the cantilever electrode 50, which are adjacent to one another. Further, an etchant or reactive gas with which the first and second sacrificial layers 50 and 70 are etched through the trench in a subsequent process may not flow properly. On the other hand, when the width of the trench 100 becomes broad, a degree of integration of a unit device may be reduced. However, an etchant or reactive gas with which the first and second sacrificial layers 50 and 70 are etched through the trench in a subsequent process may flow properly. Thus, the trench 100 is formed to have a line width with which the lower word line 30, the cantilever electrode 50 and the upper word line 40 can be symmetrically separated into multiple lower word lines, cantilever electrodes, and upper word lines, respectively, and the echant or reactive gas, with which the first and second sacrificial layers 60 and 70 are etched, can flow normally. In an embodiment, the trench 100 is formed to have a line width of about 30 to 800 Å.

Although not shown in these figures, in reducing the line width of the third hard mask layer 42, the trench 100 can be formed by subsequently and isotropically etching the third hard mask layer 42, the upper word line 40, the second sacrificial layer 70, the cantilever electrode 50, the first sacrificial layer 60 and the lower word line 30 through a dry etching method using a photoresist pattern, thereby allowing the third interlayer dielectric layer 28 at the center of a lateral direction of the upper and lower word lines 40 and 30 to be exposed as an etching mask. Similarly, when the upper word line 40 is exposed without the third hard mask layer 42 formed on the upper word line 40, the trench 100 can be formed by a dry etching method using a photoresist pattern, thereby allowing a central portion of the upper word line 40 to be exposed at the top surface thereof as an etching mask.

Figure 16A:
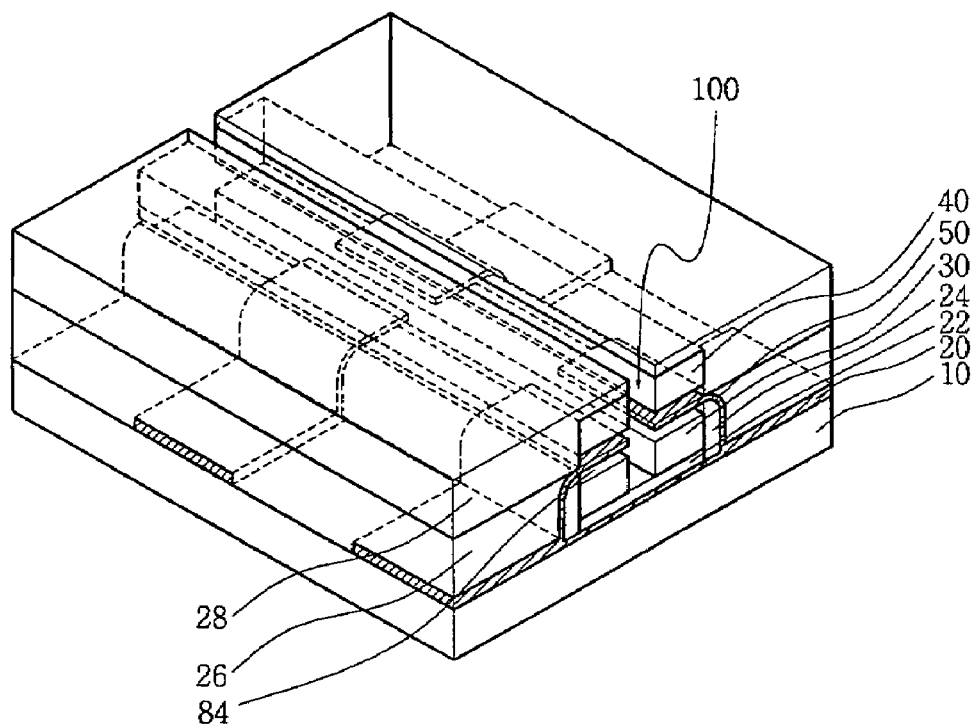
Figure 16B:
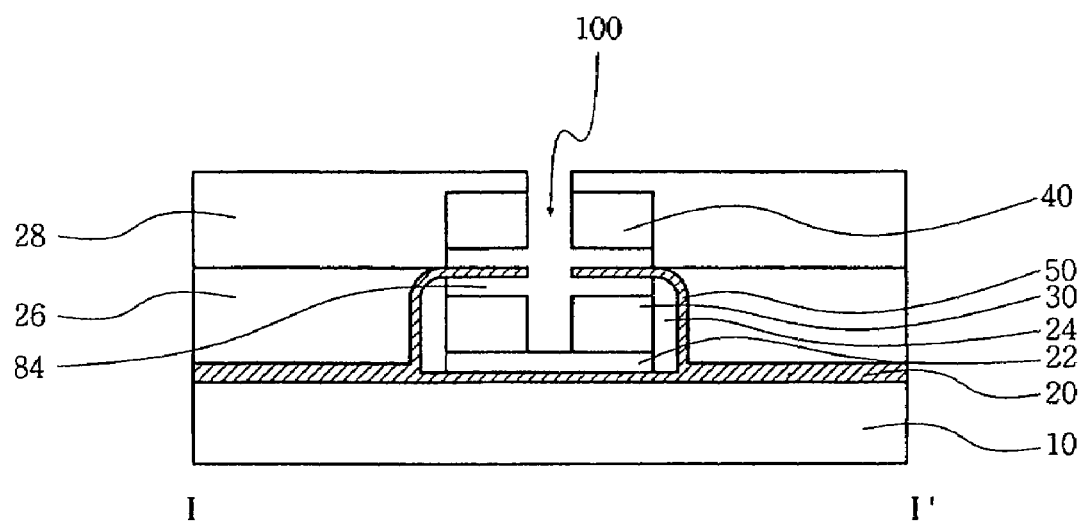

As shown in FIGS. 16A and 16B, the first and second sacrificial layers 60 and 70 exposed by the trench 100 are removed, thereby forming a predetermined air gap 84 in which the cantilever electrode 50 is floated between the lower and upper word lines 30 and 40. For example, the first and second sacrificial layers 60 and 70 can be removed by being anisotropically etched from a surface exposed on sidewalls of the trench 100 to a side thereof through a wet or dry etching method. An echant used in a wet etching method of the first and second sacrificial layers 60 and 70, each of which is made of a poly-silicon material, includes a mixed solution in which deionized water is mixed at a predetermined density with a strong acid such as nitric acid, hydrofluoric acid or acetic acid. Fluorocarbon based gas such as $CF_4$ or $CHF_3$ can be used as a reactive gas used in a dry etching method of the first and second sacrificial layers 60 and 70. The etchant or reactive gas used in the wet or dry etching process enables the air gap 84 to be formed between the upper and lower word lines 40 and 30 while removing the first and second sacrificial layers 60 and 70 exposed on the sidewalls of the trench 100 in a horizontal direction. Although not shown in these figures, when the spacer 24 is formed of a poly-silicon material, an air gap can be formed in the location of the spacer 24 by etching the spacer 24 with the echant or reactive gas. When the distance of the air gap formed by removing the spacer 24 is remarkably smaller than that of the air gap 84 between the lower word line 30 and the cantilever electrode 50, the cantilever electrode 50 does not electrically come into contact with the lower word line 30 at the top surface thereof but, instead, can be in electrical contact with a side surface of the lower word line 30, so that program and read failure of data can occur. Thus, when the spacer 24 is removed, a distance between the top surface of the lower word line 30 and the cantilever electrode 50 is formed to be larger than a distance between the side surface of the lower word line 30 and the cantilever electrode 50.

In an embodiment, a fourth interlayer dielectric layer (not shown) covering a top of the trench 100 is formed to seal an interior of the trench 100. At this time, the air gap 84 in the interior of the trench 100 may be filled with a non-reactive gas such as Nitrogen ($N_2$) or Argon (Ar) in the air. The air gap 84 may be defined to have a vacuum state such that the bending speed of the cantilever electrode 50 is increased. For example, the fourth interlayer dielectric layer is formed of a polymer material covering the third interlayer dielectric layer 28 or upper word line 40 at an upper portion of the trench 100 without flowing in the interior thereof. Further, bit lines 20, a lower word line 30, a cantilever electrode 50 and an upper word line 50 are sequentially formed on a top surface of a substrate 10 having the fourth interlayer dielectric layer 110, thereby manufacturing a memory device having a multi-layered structure.

Accordingly, in a method of manufacturing the multi-bit electro-mechanical memory device according to the embodiment of the invention, the plurality of lower word lines, cantilever electrodes 50, and upper word lines 40 are symmetrically formed, separated by the trench 100 that is formed in the second direction, and at the top surface of the bit line 20 formed in the first direction, so that a degree of integration of the memory device can be enhanced.

As described above, according to the present invention, a plurality of cantilever electrodes separated by a trench can electrically come into contact with a lower word line while moving in a direction of the lower word line due to an electrostatic force induced by the lower word line in an air gap. A current or voltage with a predetermined intensity is applied to the lower word line and the cantilever electrodes, which electrically come into contact with each other, to be isolated from each other, so that the length of the cantilever electrode can be reduced as compared with conventional cantilever electrodes. It is not required to individually fabricate a portion electrically coming into contact with the cantilever electrode 50 and a portion drawing the cantilever electrode. For at least these reasons, there is an advantage in that a degree of integration of the memory device can be enhanced and maximized.

Further, since the present invention includes a unit cell divided into multiple memory units, for example, first and second memory units illustrated in various embodiments herein, in which first and second cantilever electrodes separated around a trench individually perform switching operations, there is an advantage in that data of 2 bits or more per unit cell can be input and output.

Furthermore, each first and second lower line, to which an electrical signal is applied to allow the first and second cantilever electrodes to be switched, is made of a conductive metallic material with a resistance lower then a conventional poly-silicon material, so that power consumption can be reduced. For this reason, there is an advantage in that productivity can be enhanced or maximized.

While the foregoing has described what are considered to be the best mode and/or other preferred embodiments, it is understood that various modifications can be made therein and that the invention or inventions may be implemented in various forms and embodiments, and that they may be applied in numerous applications, only some of which have been described herein. It is intended by the following claims to claim that which is literally described and all equivalents thereto, including all modifications and variations that fall within the scope of each claim.

What is claimed is:

1. A multi-bit electro-mechanical memory device comprising:
    a substrate;
    a bit line on the substrate, the bit line extending in a first direction;
    a word line on the bit line, insulated from the bit line, and extending in a second direction transverse to the first direction; and
    a cantilever electrode including a shape memory alloy, the cantilever electrode having a first portion electrically directly connected to the bit line and a second portion extending in the first direction parallel with the bit line, and spaced apart from the word line by an air gap between a surface of the word line and the cantilever electrode, wherein the cantilever electrode, in a first state, is in electrical contact with the word line, and, in a second state, is spaced apart from the word line.

2. The multi-bit electro-mechanical memory device according to claim 1, wherein the cantilever electrode including the shape memory alloy, when in the first state, is deformed in a direction of the word line to electrically contact the word line when a first voltage is applied between the bit line and word line, and, when in the second state, is spaced apart from the word line when a second voltage lower than the first voltage and a current with a predetermined intensity are applied between the bit line and word line.

3. The multi-bit electro-mechanical memory device according to claim 2, wherein the shape memory alloy includes at least one of a TiNi alloy, a Ni—Co—Al alloy, a Ni—Mn—Ga alloy and a Cu—Zn—Al alloy.

4. The multi-bit electro-mechanical memory device according to claim 1, further comprising a spacer at a sidewall of the word line, wherein the first portion of the cantilever electrode is electrically insulated from the word line by the spacer.

5. The multi-bit electro-mechanical memory device according to claim 1, further comprising:

a first interlayer dielectric layer between the bit line and the word line; and a second interlayer dielectric layer adjacent to the cantilever electrode, and on a surface of the bit line.

6. A multi-bit electro-mechanical memory device, comprising:

a substrate;

a bit line on the substrate, the bit line extending in a first direction;

first and second lower word lines, insulated from the bit line, and extending in a second direction transverse to the first direction, the first and second lower word lines separated by a trench;

first and second cantilever electrodes each including a shape memory alloy, the first and second cantilever electrodes each having a first portion physically separate from one another, and each first portion electrically directly connected to the bit line, the first cantilever electrode having a second portion extending over the first lower word line and the second cantilever electrode having a second portion extending over the second lower word line, the first and second cantilever electrodes spaced apart from the first and second lower word lines, respectively, by air gaps between top surfaces of the first and second lower word lines and the first and second cantilever electrodes, wherein the first and second cantilever electrodes, in a first state, are in electrical contact with the first and second lower word lines, and, in a second state, are spaced apart from the first and second lower word lines; and first and second upper word lines positioned at a predetermined height above the first and second cantilever electrodes, the first and second upper word lines in the second direction parallel with the first and second lower word lines.

7. The multi-bit electro-mechanical memory device according to claim 6, wherein each of the first and second cantilever electrodes including the shape memory alloy, when in the first state, is deformed in a direction of one of the first and second upper word lines and the first and second lower word lines to electrically come into contact with the one of the first and second upper word lines and the first and second lower word lines when a first voltage is applied between the bit line and the one of the first and second upper word lines and the first and second lower word lines, and, when in the second state, is spaced apart from, and electrically isolated from, the first and second upper word lines and the first and second lower word lines by a second voltage lower than the first voltage and a current with a predetermined intensity that are applied between the bit line and each of the first and second lower word lines or each of the first and second upper word lines.

8. The multi-bit electro-mechanical memory device according to claim 7, wherein the shape memory alloy includes at least one of a TiNi alloy, a Ni—Co—Al alloy, a Ni—Mn—Ga alloy and a Cu—Zn—Al alloy.

9. The multi-bit electro-mechanical memory device according to claim 6, further comprising first and second spacers at sidewalls of the first and second lower word lines, wherein the first portions of the first and second cantilever electrodes are electrically insulated from the first and second lower word lines by the first and second spacers.

10. The multi-bit electro-mechanical memory device according to claim 9, wherein the first and second spacers include an air gap region between the first portions of the first and second cantilever electrodes and the first and second lower word lines, allowing at least one of the first and second cantilever electrodes to be spaced apart from the first and second lower word lines.

11. The multi-bit electro-mechanical memory device according to claim 6, further comprising:

a first interlayer dielectric layer between the bit line and the first and second lower word lines;

a second interlayer dielectric layer adjacent to the first and second cantilever electrodes and on a surface of the bit line; and a third interlayer dielectric layer formed on the second interlayer dielectric layer.

12. The multi-bit electro-mechanical memory device according to claim 11, wherein the trench exposes a top surface of the first interlayer dielectric layer in the second direction.

13. The multi-bit electro-mechanical memory device according to claim 6, further comprising a fourth interlayer dielectric layer that seals an interior of the trench at a top of the trench.

* * * * *